United States Patent
Honda et al.

(10) Patent No.: US 7,651,896 B2
(45) Date of Patent: Jan. 26, 2010

(54) METHOD FOR MANUFACTURING SEMICONDUCTOR DEVICE

(75) Inventors: Tatsuya Honda, Isehara (JP); Yasuyuki Arai, Atsugi (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 11/844,134

(22) Filed: Aug. 23, 2007

(65) Prior Publication Data
US 2008/0057618 A1 Mar. 6, 2008

(30) Foreign Application Priority Data
Aug. 30, 2006 (JP) .............................. 2006-233046

(51) Int. Cl.
*H01L 21/00* (2006.01)
(52) U.S. Cl. ................. 438/149; 438/754; 257/E21.305
(58) Field of Classification Search ...................... 430/5; 438/742, 149, 700, 708, 709, 717, 718, 722, 438/754; 257/E21.305
See application file for complete search history.

(56) References Cited

U.S. PATENT DOCUMENTS 4,594,471 A 6/1986 Yamazaki (Continued)

FOREIGN PATENT DOCUMENTS

JP 2000-133636 5/2000

(Continued)

OTHER PUBLICATIONS

Yamazaki, S. et al, "Mask-Less Fabrication of A-Si Solar Cell Using Laser Scribe Process," 17$^{th}$ IEEE Photovoltaic Specialists Conference, May 1-4, 1984, IEEE, 1984, pp. 206-211.

(Continued)

*Primary Examiner*—W. David Coleman
*Assistant Examiner*—Shaka Scarlett
(74) *Attorney, Agent, or Firm*—Cook Alex Ltd.

(57) ABSTRACT

An object is to provide a method for manufacturing a semiconductor device, in which the number of photolithography steps can be reduced, the manufacturing process can be simplified, and manufacturing can be performed with high yield at low cost. A method for manufacturing a semiconductor device includes the following steps: forming a semiconductor film; irradiating a laser beam by passing the laser beam through a photomask including a shield for shielding the laser beam; subliming a region which has been irradiated with the laser beam through a region in which the shield is not formed in the photomask in the semiconductor film; forming an island-shaped semiconductor film in such a way that a region which is not irradiated with the laser beam is not sublimed because it is a region in which the shield is formed in the photomask; forming a first electrode which is one of a source electrode and a drain electrode and a second electrode which is the other one of the source electrode and the drain electrode; forming a gate insulating film; and forming a gate electrode over the gate insulating film.

6 Claims, 20 Drawing Sheets

U.S. PATENT DOCUMENTS

| | | | |
|---|---|---|---|
| 4,603,470 | A | 8/1986 | Yamazaki |
| 4,725,558 | A | 2/1988 | Yamazaki et al. |
| 4,861,964 | A | 8/1989 | Sinohara |
| 4,927,493 | A | 5/1990 | Yamazaki et al. |
| 4,937,129 | A | 6/1990 | Yamazaki |
| 4,954,217 | A | 9/1990 | Yamazaki et al. |
| 4,970,368 | A | 11/1990 | Yamazaki et al. |
| 4,975,145 | A | 12/1990 | Yamazaki et al. |
| 5,089,426 | A | 2/1992 | Yamazaki et al. |
| 5,187,601 | A | 2/1993 | Yamazaki et al. |
| 5,585,949 | A | 12/1996 | Yamazaki et al. |
| 5,708,252 | A | 1/1998 | Shinohara et al. |
| 5,866,444 | A | 2/1999 | Yamazaki et al. |
| 6,149,988 | A | 11/2000 | Shinohara et al. |
| 6,261,856 | B1 | 7/2001 | Shinohara et al. |
| 6,445,005 | B1 | 9/2002 | Yamazaki et al. |
| 6,641,933 | B1 | 11/2003 | Yamazaki et al. |
| 6,670,637 | B2 | 12/2003 | Yamazaki et al. |
| 6,894,312 | B2 | 5/2005 | Yamazaki et al. |
| 6,962,837 | B2 * | 11/2005 | Yamazaki ................... 438/149 |
| 7,061,014 | B2 | 6/2006 | Hosono et al. |
| 7,112,115 | B1 | 9/2006 | Yamazaki et al. |
| 7,112,374 | B2 | 9/2006 | Yamazaki et al. |
| 7,176,069 | B2 | 2/2007 | Yamazaki et al. |
| 7,180,197 | B2 | 2/2007 | Nishi et al. |
| 7,199,516 | B2 | 4/2007 | Seo et al. |
| 7,202,155 | B2 | 4/2007 | Fukuchi |
| 7,226,819 | B2 | 6/2007 | Maekawa et al. |
| 2002/0056838 | A1 * | 5/2002 | Ogawa ........................ 257/59 |
| 2005/0039670 | A1 | 2/2005 | Hosono et al. |
| 2005/0043186 | A1 | 2/2005 | Maekawa et al. |
| 2006/0099747 | A1 * | 5/2006 | Park ........................... 438/158 |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0158482 | A1 | 7/2006 | Nakamura et al. |
| 2006/0270175 | A1 | 11/2006 | Aoki et al. |
| 2007/0051952 | A1 | 3/2007 | Yamazaki et al. |
| 2007/0194379 | A1 | 8/2007 | Hosono et al. |
| 2008/0251729 | A1 | 10/2008 | Saito et al. |

FOREIGN PATENT DOCUMENTS

| | | |
|---|---|---|
| JP | 2002-164591 | 6/2002 |

OTHER PUBLICATIONS

Yamazki, S. et al, "Fabrication of the Large-Area Integrated a-Si Solar Cells," The Materials Research Society, Mat. Res. Symp. Proc., vol. 70, Apr. 1986, pp. 487-492.

* cited by examiner

FIG. 4A
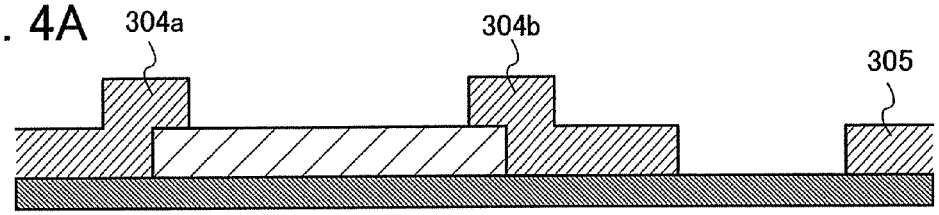
FIG. 4B
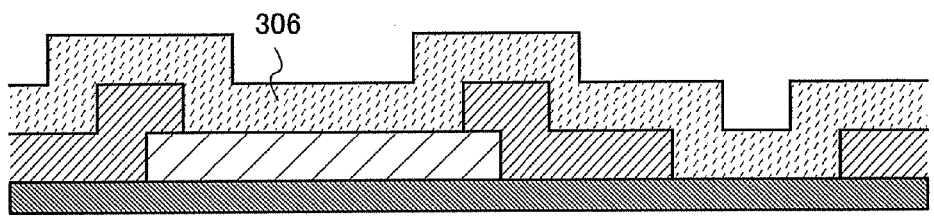
FIG. 4C
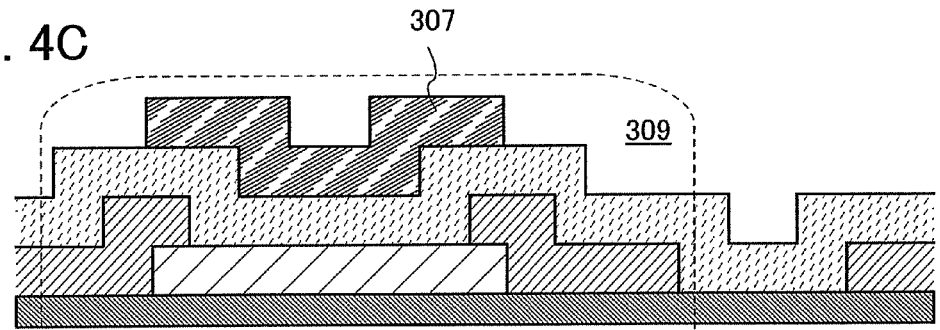
FIG. 4D
FIG. 4E
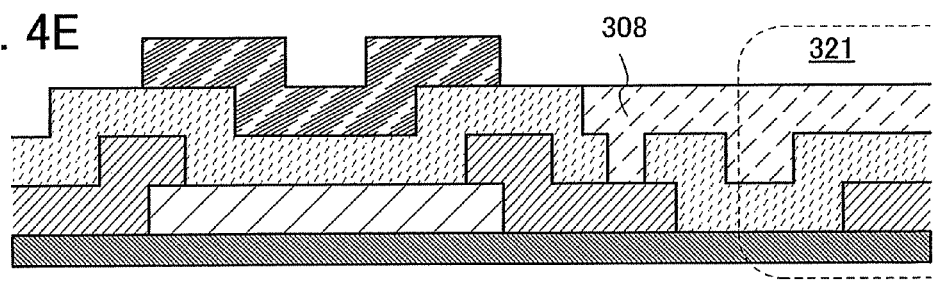

METHOD FOR MANUFACTURING SEMICONDUCTOR DEVICE

BACKGROUND OF THE INVENTION

1. Field of the Invention

The present invention relates to a semiconductor device and a manufacturing method thereof.

2. Description of the Related Art

In recent years, development of a thin film transistor (TFT) which can be formed over a flexible substrate such as a plastic substrate or paper has been conducted actively to realize a sheet display, a sheet computer, and the like.

A TFT and an electronic circuit using the TFT are manufactured in such a way that various thin films such as a semiconductor film, an insulating film, and a conductive film are stacked over a substrate, and a predetermined pattern is formed by a photolithography technique, as appropriate.

The photolithography technique is a technique to transfer a pattern of a circuit or the like formed of a material that does not transmit light, which is formed over a transparent flat plate, a so-called photomask, to a targeted substrate by using light. The photolithography technique is widely used in manufacturing steps of a semiconductor integrated circuit or the like.

A conventional manufacturing process using a photolithography technique requires multiple steps such as exposure, developing, baking, and peeling only for treating a resist mask formed using a photosensitive organic resin material that is referred to as photoresist. Therefore, as the number of photolithography steps is increased, the production cost is inevitably increased. In order to improve such a problem, a TFT has been attempted to be manufactured by decreasing the number of photolithography steps (e.g., refer to Reference 1: Japanese Published Patent Application No. 2000-133636).

SUMMARY OF THE INVENTION

As a TFT which can be formed over a flexible substrate, attention has been focused on a TFT in which a zinc oxide (ZnO) semiconductor that can be formed at room temperature is used as an active layer (hereinafter referred to as a "ZnO-TFT").

In addition to being formed at room temperature, zinc oxide (ZnO) has TFT characteristics, for example, the mobility which is several tens of times higher than a TFT in which amorphous silicon (a-Si) is used as an active layer (hereinafter also referred to as "a-Si TFT").

However, zinc oxide is vulnerable to acid and alkali and has a property to be dissolved in hydrofluoric acid, peeling liquid, or the like easily. Therefore, the etching of zinc oxide has been very difficult.

In addition, since zinc oxide tends to store charge, there is a problem in that electrical damage due to plasma is generated and TFT characteristics are deteriorated when etching is performed by using a dry etching device or the like.

Thus, an object of the present invention is to provide a method for manufacturing a semiconductor device in which an oxide semiconductor that forms a TFT is not deteriorated due to chemical solution or plasma damage.

Thus, in the present invention, an active layer, an electrode, a wiring, or the like is formed by using zinc oxide (ZnO) by laser ablation patterning (LAP) and laser ablation adhesion patterning (LAAP) without a resist application and peeling step. Accordingly, the number of manufacturing steps decreases and a semiconductor device with low production cost can be obtained.

Thus, one feature of the present invention is to process an oxide semiconductor film, for example, a zinc oxide film by using a laser beam. In addition, an oxide semiconductor such as zinc oxide is easily sublimed by laser beam irradiation, and a processing technique to form patterns of an electrode and a wiring can be added by using this property. In any case, in the present invention, at least part of a manufacturing step of a semiconductor device includes a step for forming a thin film pattern by irradiating the oxide semiconductor film with the laser beam. Therefore, complicated steps such as application of the resist, exposure, developing, and peeling which are conventional requirements can be omitted.

Note that, in this specification, formation of a film by removing part of the film by using laser ablation is referred to as laser ablation patterning (hereinafter also referred to as "LAP").

In addition, formation of a film (first film) which is removed by laser ablation over the first substrate, formation of a second film over the first film, and transfer of the second film to a second substrate are referred to as laser adhesion ablation patterning (hereinafter referred to as "LAAP").

Zinc oxide is a material having a high sublimation property and sublimed at 1720° C. Therefore, when the zinc oxide film is irradiated with laser light having sufficient energy to sublimate zinc oxide, for example, KrF excimer laser light, the zinc oxide film is sublimed and a region irradiated with laser light is removed.

When such laser ablation patterning (LAP) is applied, an unnecessary zinc oxide film can be sublimed by laser light irradiation and the zinc oxide film can be formed without a resist application and peeling step.

Further, since there is no step of resist application and peeling, a process can be shortened as well. In addition, plasma damage is not generated in this process; therefore, TFT characteristics are not deteriorated.

Furthermore, a desired film can be formed without a resist application and peeling step by using laser adhesion ablation patterning (LAAP) in which a material that is desired to be formed is formed over a zinc oxide film over a substrate, the zinc oxide film is sublimed by laser light irradiation to be removed, and the material which is desired to be formed is formed over another substrate.

The present invention relates to a method for manufacturing a semiconductor device, including the following steps: forming a first semiconductor film over a substrate; irradiating the first semiconductor film with a laser beam through a photomask including a shield for shielding the laser beam; subliming a first region in the first semiconductor film which has been irradiated with the laser beam through a region in which the shield in the photomask is not formed; forming an island-shaped semiconductor film in such a way that a region in which the shield in the photomask is formed serves as a mask, and a second region which is not irradiated with the laser beam in the first semiconductor film remains without being sublimed; forming a first electrode which is one of a source electrode and a drain electrode and a second electrode which is the other one of the source electrode and the drain electrode over the island-shaped semiconductor film; forming a gate insulating film over the island-shaped semiconductor film, the first electrode, and the second electrode; and forming a gate electrode over the gate insulating film.

In the present invention, one of the source electrode and the drain electrode is formed in such a way that a shield for shielding a laser beam, which is formed over a light-transmitting substrate, is used as a photomask, a second semiconductor film formed as a first layer and a metal film formed as a second layer which are formed over a light-transmitting substrate are used as a source substrate, and the metal film is formed over the island-shaped semiconductor film as one of the source electrode and the drain electrode by subliming the second semiconductor film in such a way that the source substrate is irradiated with the laser beam through the photomask.

In addition, the present invention relates to a method for manufacturing a semiconductor device, including the following steps: forming a gate electrode and a gate insulating film over a substrate; forming a first semiconductor film over the gate insulating film; irradiating the first semiconductor film with a laser beam through a photomask including a shield for shielding the laser beam; forming a groove by subliming part of a region of the first semiconductor film irradiated with the laser beam through a region in which the shield is not formed and dividing the first semiconductor film into an island-shaped semiconductor film to serve as an active layer and a region which does not function as the active layer by the groove; forming an insulating film over the island-shaped semiconductor film and the region which does not function as the active layer; and forming one of a source electrode and a drain electrode which is electrically connected to the island-shaped semiconductor film, over the insulating film.

In the present invention, the gate electrode is formed in such a way that a shield for shielding a laser beam formed over a light-transmitting substrate is used as a photomask, a second semiconductor film formed as a first layer and a metal film formed as a second layer which are formed over a light-transmitting substrate are used as a source substrate, and the metal film is formed over the substrate as the gate electrode by subliming the second semiconductor film in such a way that the source substrate is irradiated with the laser beam through the photomask.

In the present invention, the first semiconductor film is any one of a zinc compound semiconductor film and an oxide semiconductor film.

In the present invention, the second semiconductor film is any one of a zinc compound semiconductor film and an oxide semiconductor film.

In the present invention, the zinc compound semiconductor film includes any one of zinc oxide (ZnO), a mixed crystal semiconductor containing zinc oxide, and zinc sulfide (ZnS).

Note that in this specification, a semiconductor device is referred to as a device having a semiconductor layer, and an entire device including an element having the semiconductor layer is also referred to as a semiconductor device.

Since zinc oxide does not absorb visible light, no TFT characteristics are changed due to external light, as an a-Si TFT, and a shield such as a black matrix (BM) is not required.

Therefore, when zinc oxide is used, a TFT with high mobility without the need to form the BM can be formed.

In addition, according to the present invention, in a manufacturing step of a TFT, an electronic circuit using the TFT, and a semiconductor device formed of the TFT, the number of photolithography steps can be reduced, the manufacturing process can be simplified, and manufacturing can be performed with high yield at low cost.

BRIEF DESCRIPTION OF THE DRAWINGS

FIGS. 4A to 4E are cross-sectional views showing a method for manufacturing a semiconductor device of the present invention.

DETAILED DESCRIPTION OF THE INVENTION

Figure 1A:
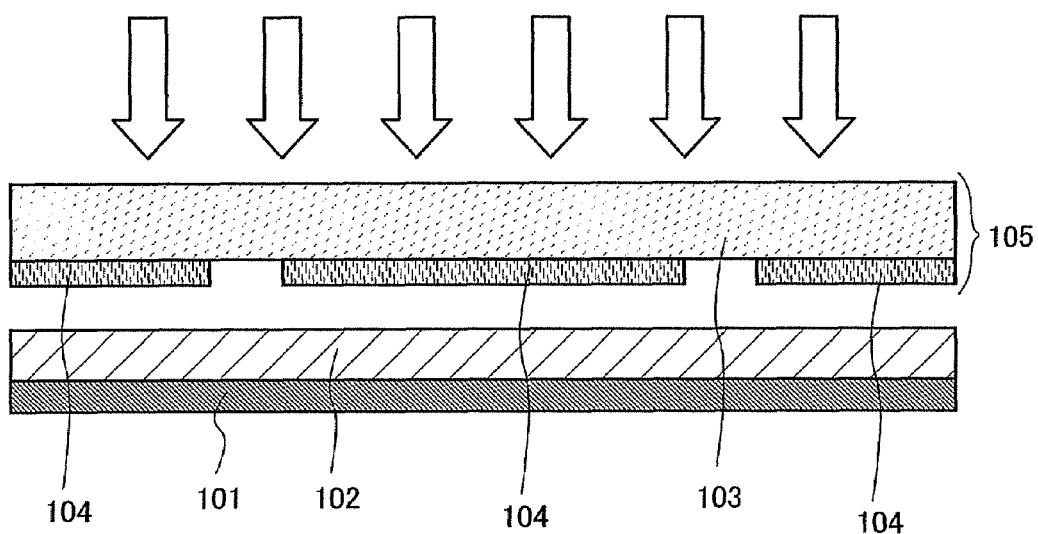
FIGS. 1A and 1B are cross-sectional views showing a method for manufacturing a semiconductor device of the present invention.

Hereinafter, embodiment modes of the present invention will be described with reference to the accompanying drawings. However, the present invention can be implemented in various modes. As can be easily understood by a person skilled in the art, the modes and details of the present invention can be changed in various ways without departing from the spirit and scope of the present invention. Thus, the present invention should not be interpreted as being limited to the following description of the embodiment modes. Note that, in the drawings hereinafter shown, the same portions or portions having similar functions are denoted by the same reference numerals, and repeated description thereof will be omitted.

Embodiment Mode 1

This embodiment mode will be described with reference to FIGS. 1A and 1B, FIGS. 2A to 2D, FIGS. 3A to 3C, FIGS. 4A to 4E, FIGS. 13A and 13B, and FIG. 14.

As a photomask for LAP (Laser Ablation Patterning) or LAAP (Laser Ablation Adhesion Patterning), a light-transmitting substrate is used. As the light-transmitting substrate, a substrate which transmits a laser beam to be delivered later can be used. Accordingly, a substrate which does not absorb a wavelength of the laser beam, which is to be formed later, may be selected as appropriate. Here, as a typical example of the substrate which transmits the laser beam to be delivered later, there are a quartz substrate, a glass substrate, a resin substrate, and the like.

A shield which shields a laser beam is formed over the light-transmitting substrate, and shapes of a region which is irradiated with a laser beam and a region which is not irradiated with a laser beam are determined.

In addition, as a laser beam, typically, a laser beam in an ultraviolet region, a visible region, or an infrared region is selected as appropriate to be delivered. In accordance with a semiconductor which is desired to be sublimed, a wavelength, the amplitude, the energy density, the power density, or the like of the laser beam may be changed.

As a laser oscillator which can oscillate such a laser beam, an excimer laser oscillator such as KrF, ArF, XeCl, or Xe; a gas laser oscillator such as He, He—Cd, Ar, He—Ne, or HF; a solid-state laser oscillator using, as a medium, single crystalline YAG, YVO$_4$, forsterite (Mg$_2$SiO$_4$), YAlO$_3$, or GdVO$_4$ or polycrystalline (ceramic) YAG, Y$_2$O$_3$, YVO$_4$, YAlO$_3$, or GdVO$_4$ doped with one or more of Nd, Yb, Cr, Ti, Ho, Er, Tm, and Ta as a dopant; or a semiconductor laser oscillator such as GaN, GaAs, GaAlAs, or InGaAsP can be used. Note that in the case of using a solid-state laser oscillator, it is preferable to use the fundamental wave to the fifth harmonic, as appropriate.

In addition, a continuous wave laser beam or a pulsed laser beam can be used as appropriate. Although a frequency band of several tens of Hz to several hundreds of Hz is generally used for the pulsed laser beam, a pulsed laser with a repetition rate of 10 MHz or more that is remarkably higher than the frequency band of several tens of Hz to several hundreds of Hz, a repetition rate with a pulse width on the order of picoseconds, or a repetition rate on the order of femtoseconds ($10^{-15}$ seconds) may be used.

The cross-sectional shape of a laser beam may be circular, elliptical, rectangular, or linear (specifically, slim rectangular) may be used as appropriate. In addition, it is preferable that a laser beam be processed by an optical system so as to have such a cross-sectional shape.

It is preferable that a laser beam have sufficient energy or power to sublimate a targeted semiconductor film.

For example, when KrF excimer laser light is an exposure light source, a quartz substrate which transmits ultraviolet light is used.

Furthermore, as a material which shields ultraviolet light, it is necessary to select a material which absorbs ultraviolet light and which is not melted or sublimed by ultraviolet light.

As such a material, for example, an AlGaN based semiconductor, a SiC semiconductor, and silicide such as MoSi$_2$ are considered. In addition, aluminum (Al) (reflectivity>90%) and an Al alloy each having high reflectance of ultraviolet light may be used as well. Furthermore, a reflective film having a stacked-layer film in which a refractive index is changed may be combined with a material which shields ultraviolet light.

In this manner, when a material which shields a laser beam is formed into a predetermined shape over a substrate, a photomask can be manufactured. With this photomask, a semiconductor film or a wiring material film can be formed and shaped at the same time.

In this embodiment mode, as a semiconductor film which is used for an active layer of a TFT, zinc oxide (ZnO) is mainly given as an example for description. A zinc compound semiconductor film formed of a mixed crystal semiconductor containing zinc oxide, zinc sulfide (ZnS), or the like as well as zinc oxide, or an oxide semiconductor film can be used.

First, when a zinc oxide film is used as a semiconductor film and KrF excimer laser light is used as laser light, a step for forming an island-shaped semiconductor film is described.

As shown in FIG. 1A, a zinc oxide film 102 formed over a substrate 101 is irradiated with KrF excimer laser light through a photomask 105. The photomask 105 has a structure in which ultraviolet shielding materials 104 are provided on a quartz substrate 103. That is, the photomask 105 is formed in such a way that laser light does not pass through a region provided with the ultraviolet shielding materials 104 and laser light passes through a region without the ultraviolet shielding materials 104.

Figure 1B:
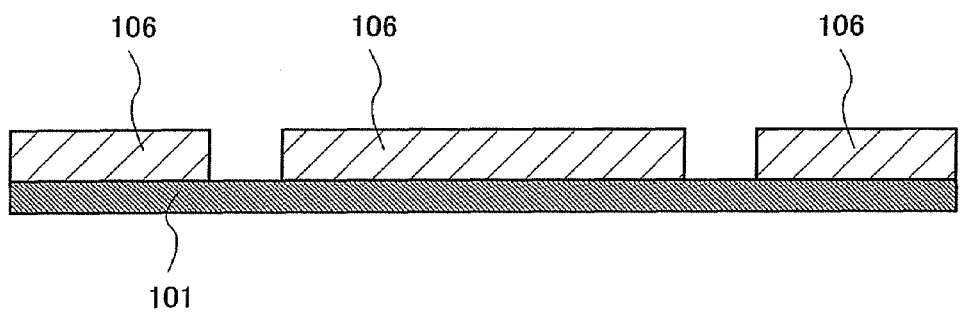

Then, as shown in FIG. 1B, the zinc oxide film in the region which is irradiated with laser light is sublimed and the zinc oxide film in the region which is not irradiated with laser light is left, whereby island-shaped zinc oxide films 106 are formed. Note that a base film may be formed between the substrate 101 and the zinc oxide film 102.

With this step, the island-shaped zinc oxide films 106 can be obtained without forming and etching a resist mask.

Next, by using a wiring material, a step for forming a wiring (or an electrode) is described. As a metal film to serve as the wiring material, a single-layer film formed of tungsten, aluminum, titanium, tantalum, or the like; or a multilayer film with a combination of these can be used.

In the formation of the wiring, formation and shaping can be performed at the same time by using LAAP. It is difficult to laser ablate the metal film to serve as a wiring material; however, formation and shaping can be performed through a material which is easily laser ablated, for example, zinc oxide.

Figure 2A:
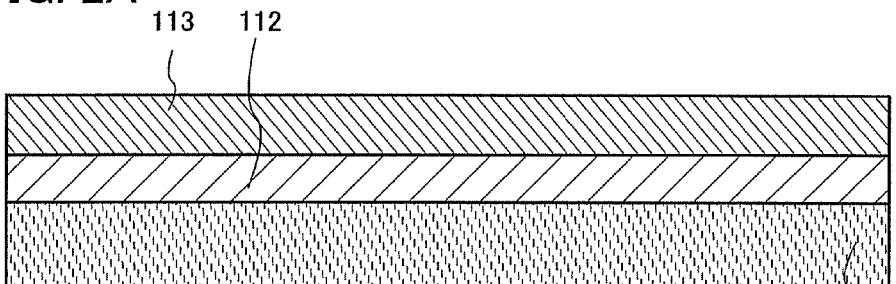
FIGS. 2A to 2D are cross-sectional views showing a method for manufacturing a semiconductor device of the present invention.

As shown in FIG. 2A, a zinc oxide film 112 is formed over a quartz substrate 111 which transmits ultraviolet light, and a metal film 113 is formed thereover, which serve as a source substrate of the metal film 113.

Figure 2B:
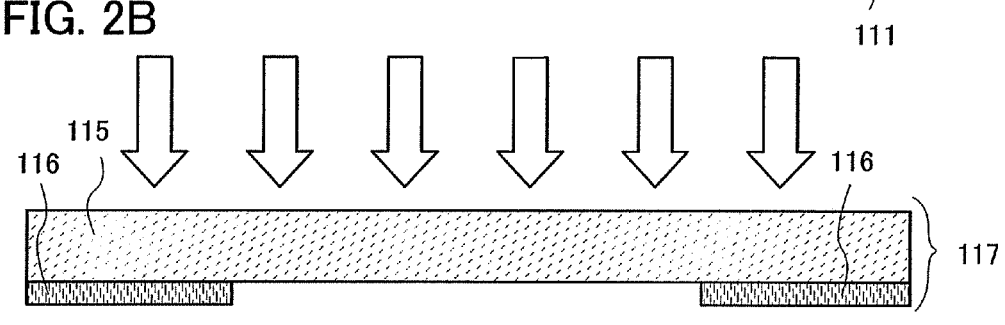

Next, as shown in FIG. 2B, the surface of the metal film 113 faces a substrate 114 over which a film is desired to be formed, and laser light is delivered from a surface of the quartz substrate 111 on which the zinc oxide (ZnO) film 112 and the metal film 113 are not formed, through a photomask 117. Although the photomask 117 is provided with ultraviolet shielding materials 116 on a quartz substrate 115, a region in which the zinc oxide film 112 is desired to be sublimed is not provided with the ultraviolet shielding materials 116.

Figure 2C:
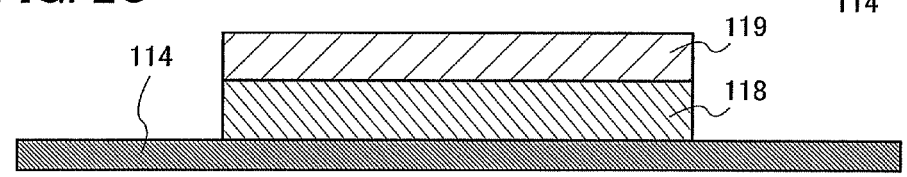

Therefore, as shown in FIG. 2C, the region of the zinc oxide film 112, which has been irradiated with laser light, on the substrate 111 is sublimed, and at the same time, part of the metal film 113 which has existed on the region in which the zinc oxide film 112 is sublimed is formed over the substrate 114. In this manner, an island-shaped wiring region 118 and an island-shaped zinc oxide film 119 can be obtained over the substrate 114.

Figure 2D:
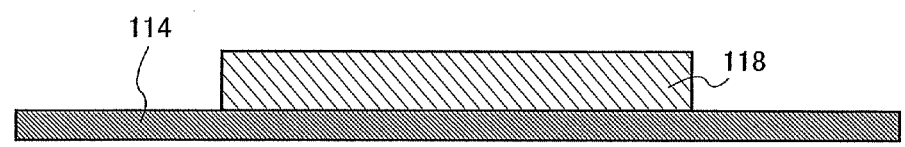

Further, the island-shaped zinc oxide film 119 over the island-shaped wiring region 118 can be removed easily with hydrofluoric acid because the etch rate for zinc oxide in hydrofluoric acid is very high (1000 nm/min in 1/100 HF solution) (see FIG. 2D).

By using the above-described steps, a step for manufacturing a thin film transistor (TFT) is described with reference to FIGS. 3A to 3C, FIGS. 4A to 4E, FIGS. 13A and 13B, and FIG. 14.

First, a zinc oxide (ZnO) film 302 is formed to have a thickness of 50 nm to 200 nm over a substrate 301, by a sputtering method or the like. Note that a base film may be formed between the substrate 301 and the zinc oxide film 302.

Next, an island-shaped zinc oxide film is formed. Similarly to FIG. 1A, KrF excimer laser light is passed through a photomask 313 (see FIG. 3A). Accordingly, a region other than an island-shaped zinc oxide film 303 to serve as an active layer is removed to form the island-shaped zinc oxide film 303 (see FIG. 3B).

Figure 3A:
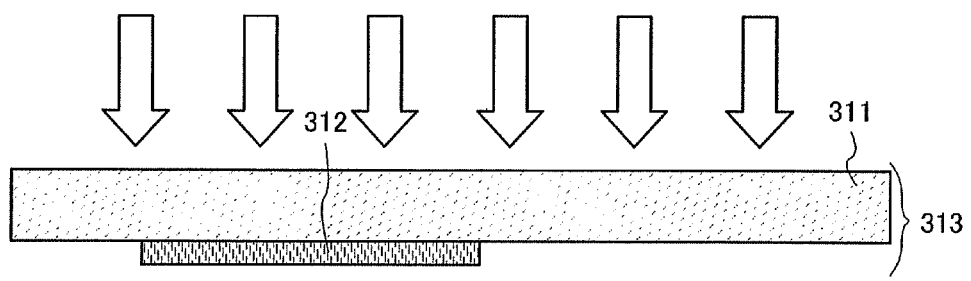
FIGS. 3A to 3C are cross-sectional views showing a method for manufacturing a semiconductor device of the present invention.
Figure 3B:
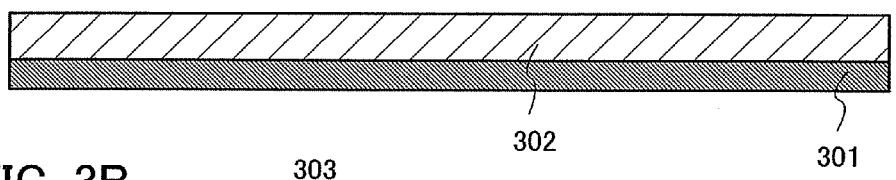
Figure 3C:
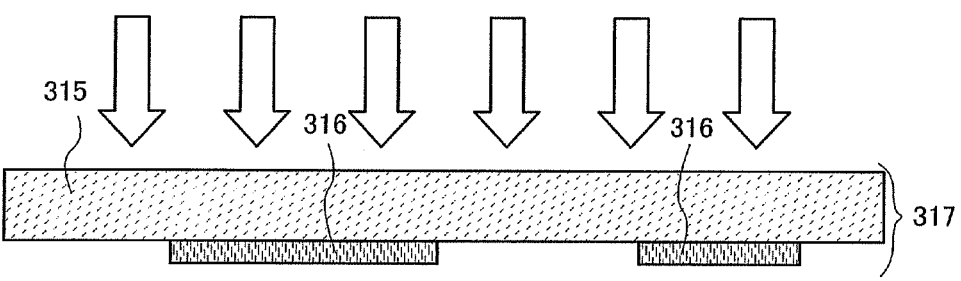
Figure 3C:
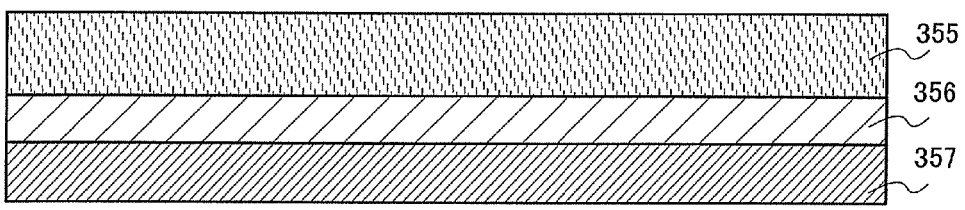
Figure 3C:
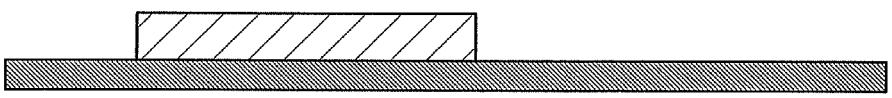

Note that, in FIG. 3A, zinc oxide (ZnO) is mainly given as an example for description. A zinc compound semiconductor film formed of a mixed crystal semiconductor containing zinc oxide, zinc sulfide (ZnS), or the like as well as zinc oxide, or an oxide semiconductor film can be used,.

The photomask 313 is formed of shields 312 on a quartz substrate 311. As such a material for forming the shields 312, for example, an AlGaN based semiconductor, a SiC semiconductor, and silicide such as $MoSi_2$ are considered. Here, SiC may be used.

Although a quartz substrate is used as a substrate of the photomask 313, a light-transmitting substrate such as a glass substrate, a resin substrate, and the like can be used besides the quartz substrate.

Figure 13A:
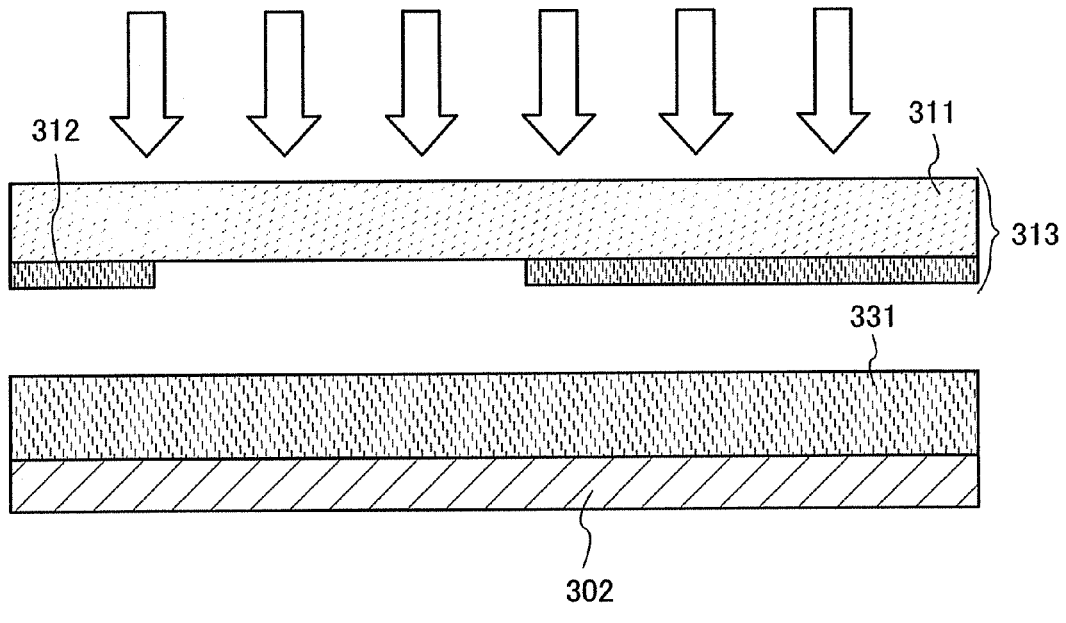
FIGS. 13A and 13B are cross-sectional views showing a method for manufacturing a semiconductor device of the present invention.

In addition, the island-shaped zinc oxide film can be formed using LAAP. As shown in FIG. 13A, a quartz substrate 331 provided with the zinc oxide film 302 having a thickness of 50 nm to 200 nm is used as a source substrate, and KrF excimer laser light may be delivered from the quartz substrate 331 side by using the photomask 313. The photomask 313 includes the light-transmitting substrate 311 and the shields 312. The shields 312 on the substrate 311 are not formed in a region corresponding to a region in which the island-shaped zinc oxide film 303 is formed so as to transmit laser light.

Next, a source electrode, a drain electrode, and the like which are electrically connected to the island-shaped zinc oxide film 303 are formed over the substrate 301 and the island-shaped zinc oxide film 303.

When the source electrode, the drain electrode, and the like are formed using LAAP, formation and shaping can be performed at the same time. As a source substrate of LAAP, a zinc oxide film 356 is formed to have a thickness of 50 nm to 100 nm on a quartz substrate 355 by sputtering or the like, and a metal film, for example, a stacked-layer film (hereinafter also referred to as a "Al—Ti film") 357 formed of aluminum (Al) and titanium (Ti) is formed to have a thickness of 100 nm to 200 nm on the zinc oxide film 356 by sputtering or the like.

Next, through a photomask 317, KrF excimer laser light is delivered from a back surface of the source substrate. The photomask 317 includes a light-transmitting substrate 315 and shields 316. The shields 316 on the substrate 315 are not formed in a region corresponding to a region in which the source electrode and the drain electrode are formed so as to transmit laser light. Accordingly, the zinc oxide film 356 in the region through which laser light has passed is sublimed. Due to the stacked-layer film 357, an electrode 304a which is either one of the source electrode and the drain electrode, an electrode 304b which is the other one of the source electrode and the drain electrode, and an electrode 305 in the case of forming a capacitor can be formed (see FIG. 4A). Although not shown, the zinc oxide film on the source electrode and the drain electrode can be left as an insulator.

In addition, the stacked-layer film (Al—Ti film) formed of aluminum (Al) and titanium (Ti) to serve as the source electrode, the drain electrode, and the like, may be formed to have a thickness of 100 nm to 200 nm by sputtering or the like, without using LAAP.

Furthermore, as the source electrode, the drain electrode, a gate wiring, an electrode, a wiring, a pixel electrode in the case of a reflective display device which are described later, a single-layer film formed of tungsten, aluminum, titanium, tantalum, or the like; or a multilayer film with a combination of these can be used. Alternatively, a metal nanopaste of silver, gold, or the like can be formed by using an ink-jet device or the like.

Next, a gate insulating film 306 of a TFT is formed to have a thickness of 100 nm to 300 nm by sputtering, CVD, or the like (see FIG. 4B). In this embodiment mode, a silicon nitride (SiN) film is used for the gate insulating film 306.

In addition, as an interlayer insulating film which is formed by covering the gate insulating film or the TFT, a single-layer film such as a silicon oxide film, a silicon oxide film containing nitrogen, a silicon nitride film, or an aluminum oxide film; or a multilayer film with a combination of these can be used.

A gate wiring 307 is formed over the gate insulating film 306. As a method for forming the gate wiring 307, there is a method by which a metal film, for example, molybdenum (Mo) is formed to have a thickness of 100 nm to 300 nm by sputtering or the like and etching is performed by wet etching or dry etching. Thus, a thin film transistor (TFT) 309 is formed.

Figure 14:
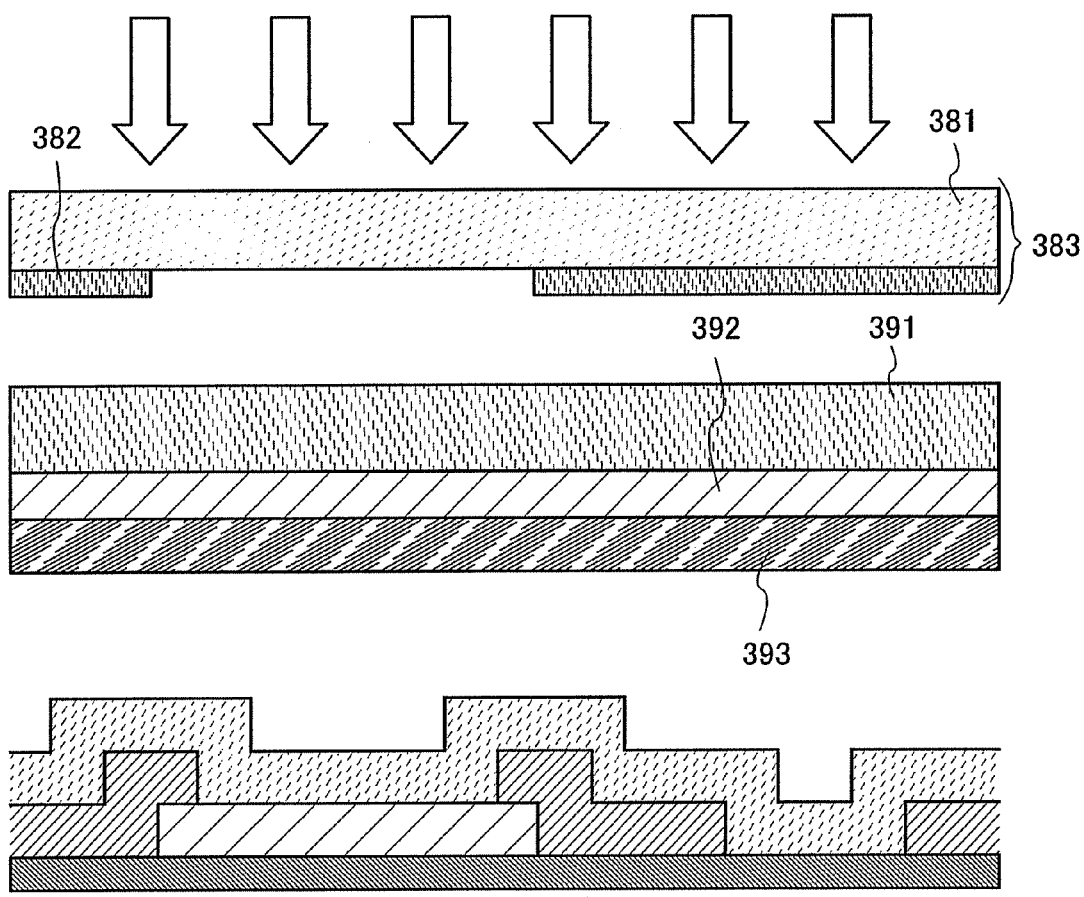
FIG. 14 is a cross-sectional view showing a method for manufacturing a semiconductor device of the present invention.

Alternatively, the gate wiring 307 can be formed by performing formation and shaping at the same time by using LAAP. As shown in FIG. 14, as a source substrate of LAAP, a material which is sublimed by laser irradiation, for example, a zinc oxide film 392 is formed to have a thickness of 50 nm to 100 nm on a quartz substrate 391 by sputtering or the like, and a metal film 393, for example, molybdenum (Mo) is formed to have a thickness of 100 nm to 300 nm on the zinc oxide film 392 by sputtering or the like. Then, through a photomask 383 having shields 382, a laser beam, for example, KrF excimer laser light is delivered from a back surface of the source substrate. The photomask 383 includes a light-transmitting substrate 381 and the shields 382. The shields 382 on the substrate 381 are not formed in a region corresponding to a region in which the gate wiring: 307 is formed so as to transmit laser light. Accordingly, the zinc oxide film 392 in the region through which laser light has passed is sublimed, and the metal film is formed as the gate wiring 307.

Thus, the gate wiring 307 can be formed. The zinc oxide film on the molybdenum film can be easily removed with hydrofluoric acid, or can be left as an insulator.

The case in which a capacitor 321 and a pixel electrode 308 are formed following the TFT 309 is described.

Next, part of the gate insulating film 306 of the TFT 309 is removed, and the electrode 304b which is the other one of the source electrode and the drain electrode is exposed to form an opening (see FIG. 4D). A mask is formed using an exposure device, an ink-jet device, or the like, and the gate insulating film 306 may be etched by wet etching or dry etching. Thus, the TFT 309 is separated.

Alternatively, LAP can be used for forming the opening by exposing the electrode 304b. The gate insulating film 306 is irradiated with infrared YAG laser light through a photomask for forming the opening. Thus, the gate insulating film 306 can be ablated to be removed. At this time, the electrode 304a, the electrode 304b, and the electrode 305 under the gate insulating film 306 can be left without ablation when an output of the laser light is adjusted.

Next, the pixel electrode 308 is formed. The pixel electrode 308 may be formed using a light-transmitting conductive film in the case of forming a transmissive display device, while in the case of forming a reflective display device, the pixel electrode 308 may be formed using a reflective conductive film. For example, the pixel electrode 308 may be formed in such a way that indium tin oxide (ITO) is formed to have a thickness of 100 nm to 200 nm by sputtering or the like and etching is performed by wet etching or dry etching.

Furthermore, the capacitor 321 is formed of the electrode 305, the gate insulating film 306, and the pixel electrode 308.

Note that, as the pixel electrode 308, a single-layer film formed of indium tin oxide (ITO), indium tin oxide containing silicon oxide (also referred to as ITSO), organic indium, organotin, zinc oxide, or titanium nitride; or a stacked-layer film of these can be used as a light-transmitting conductive film.

In addition, as the reflective conductive film, a single-layer film formed of tungsten (W), aluminum (Al), titanium (Ti), tantalum (Ta), silver (Ag), gold (Au), copper (Cu), or the like; or a multilayer film with a combination of these can be used. Alternatively, a metal nanopaste of silver, gold, or the like can be formed by using an ink-jet device or the like.

Figure 13B:
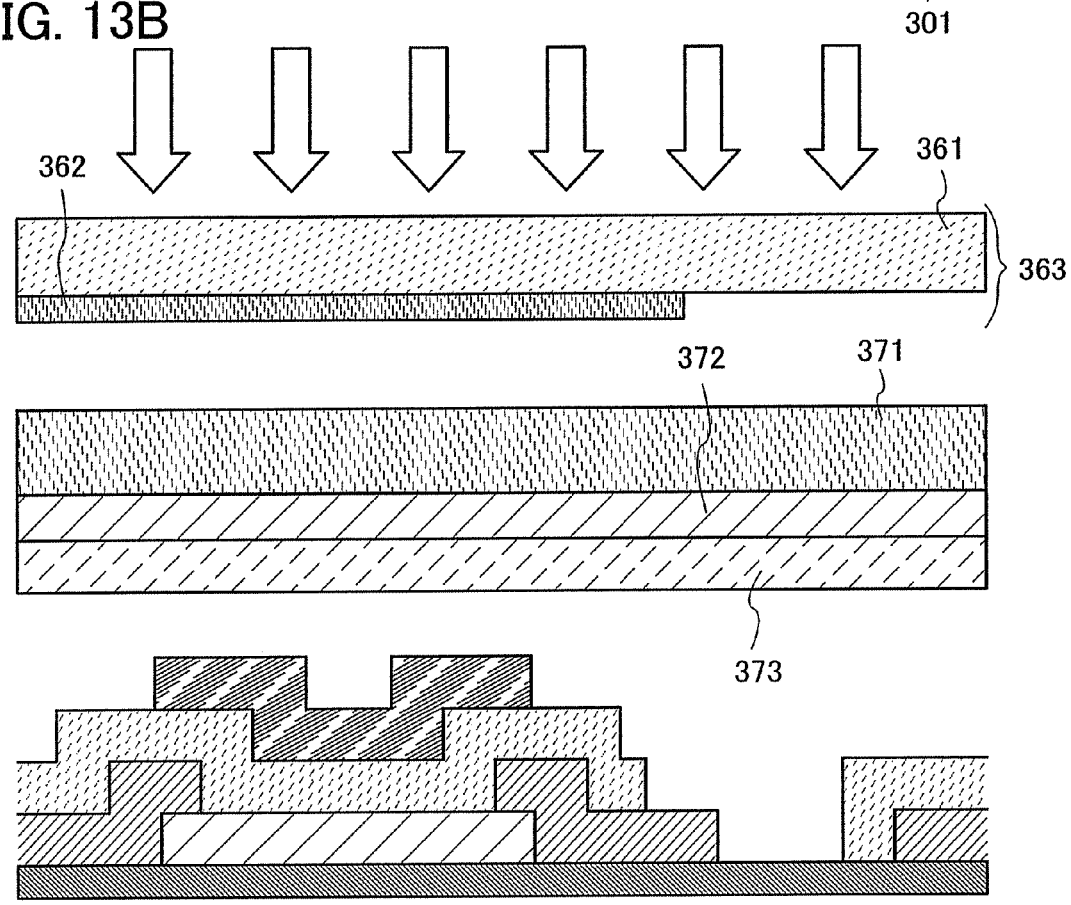

As the method for forming the pixel electrode 308, LAAP can be used as well. As shown in FIG. 13B, a zinc oxide film 372 and an ITO film 373 having a thickness of 100 nm to 200 nm, which are formed on a quartz substrate 371, are formed as a source substrate, and KrF excimer laser light may be delivered from the quartz substrate 371 side by using a photomask 363. The photomask 363 includes a light-transmitting substrate 361 and a shield 362. The shield 362 on the substrate 361 is not formed in a region corresponding to a region in which the pixel electrode 308 is formed so as to transmit laser light. Accordingly, the zinc oxide film 372 in the region through which laser light has passed is sublimed, and the ITO film is formed as the pixel electrode 308.

In this embodiment mode, the example of a top gate structure is shown; however, a bottom gate structure such as a reverse stagger structure can be similarly used.

Embodiment Mode 2

In this embodiment mode, an example in which a bottom gate TFT is manufactured using the present invention will be described with reference to FIGS. 15A to 15C, FIGS. 16A and 16B, FIGS. 17A to 17C, and FIGS. 18A and 18B.

Figure 15A:
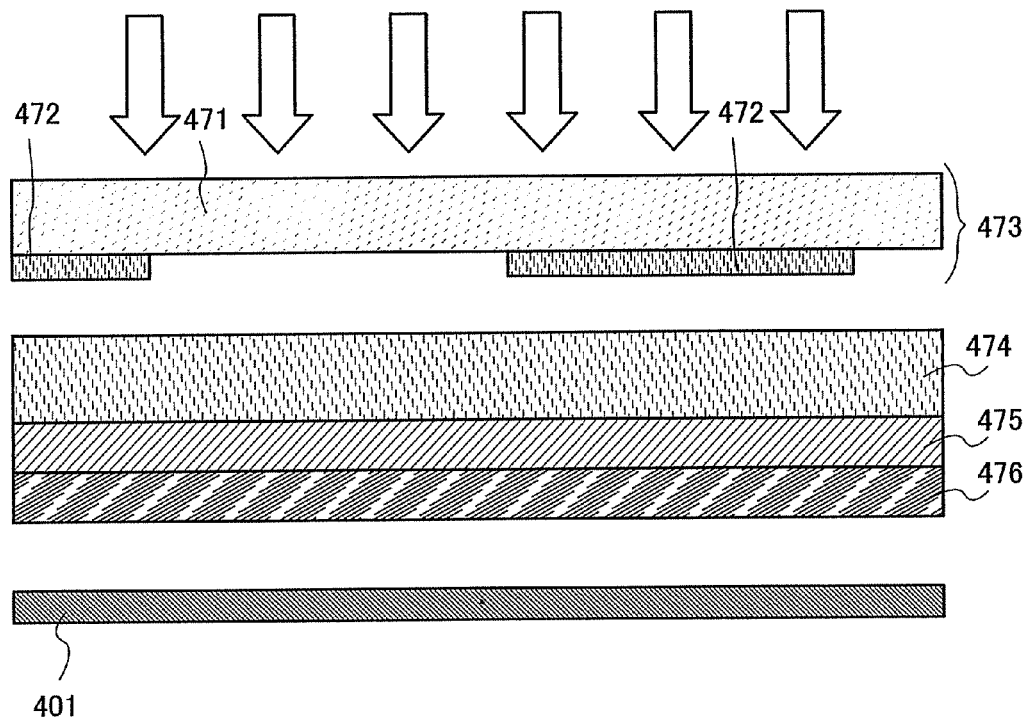
FIGS. 15A to 15C are cross-sectional views showing a method for manufacturing a semiconductor device of the present invention.

As shown in FIG. 15A, as a photomask 473, light-shielding layers 472 are formed on a light-transmitting substrate 471. Here, as the light-shielding layers 472, a tungsten layer having a thickness of 10 nm to 1000 nm or more is formed on the light-transmitting substrate 471 by a sputtering method.

In addition, as a source substrate, a light-transmitting substrate 474, a zinc oxide (ZnO) film 475, and a metal film 476 are formed. The source substrate is provided between the photomask 473 and a substrate 401. As the metal film 476, a similar material to the gate wiring 307 in Embodiment Mode 1 may be used.

Figure 15B:
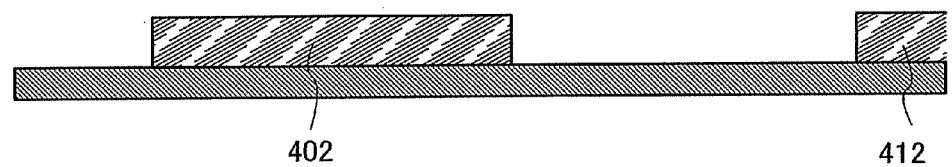

Next, a laser beam is passed through the photomask 473 and the source substrate. As a result, a gate electrode 402 and an electrode 412 are formed, as shown in FIG. 15B.

Note that the gate electrode 402 and the electrode 412 may be formed by a droplet discharge method by which a layer having a predetermined shape is formed by discharging a droplet of a controlled composition through a fine hole. In addition, a printing method may be used. Furthermore, after a conductive layer is formed on the substrate by a CVD method, a PVD method, a coating method, or the like, the conductive layer is selectively etched by a photolithography step, and the gate electrode 402 and the electrode 412 may be formed.

Figure 15C:
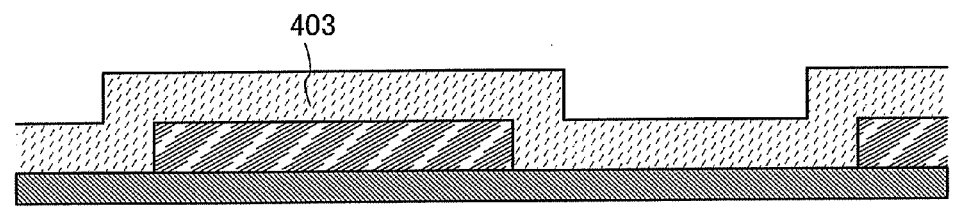

Next, as shown in FIG. 15C, a gate insulating film 403 is formed over the substrate 401, the gate electrode 402, and the electrode 412. Here, a silicon nitride film having a thickness of 50 nm to 200 nm is formed by a plasma CVD method.

Figure 16A:
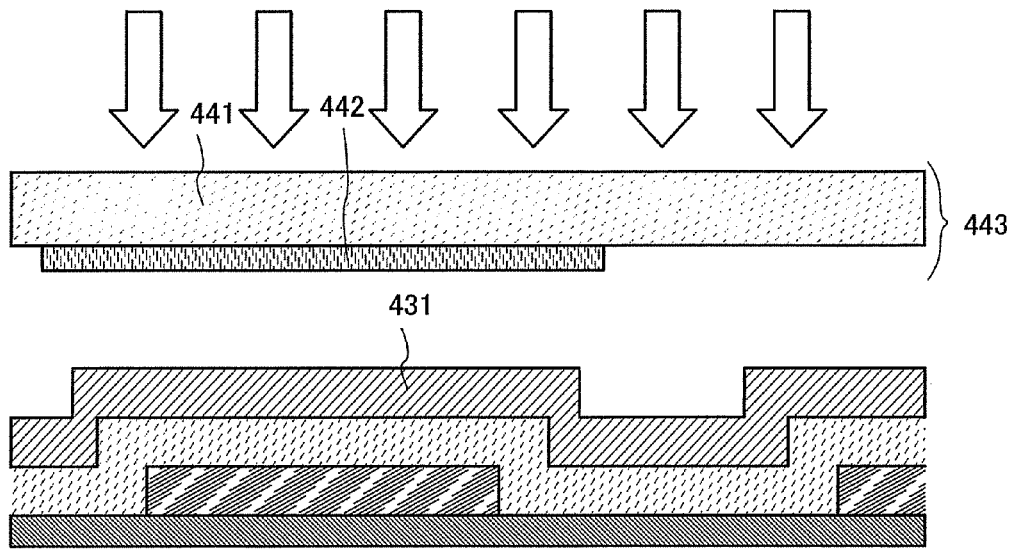
FIGS. 16A and 16B are cross-sectional views showing a method for manufacturing a semiconductor device of the present invention.
Figure 16B:
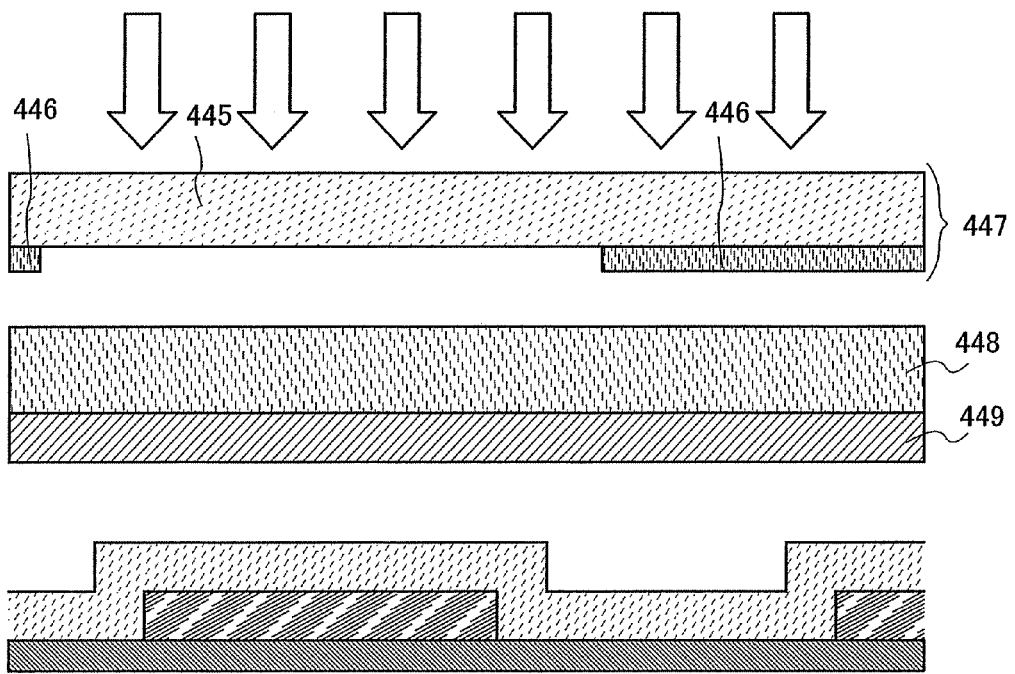

Then, an island-shaped semiconductor film to serve as an active layer of a TFT is formed, and either one of two following methods shown in FIGS. 16A and 16B may be used.

In FIG. 16A, a zinc oxide film 431 is formed over the gate insulating film 403, and a laser beam is passed through a photomask 443. The photomask 443 includes a light-transmitting substrate 441 and a light-shielding layer 442. The light-shielding layer 442 is formed only in a region corresponding to an island-shaped semiconductor film 404.

Figure 17A:
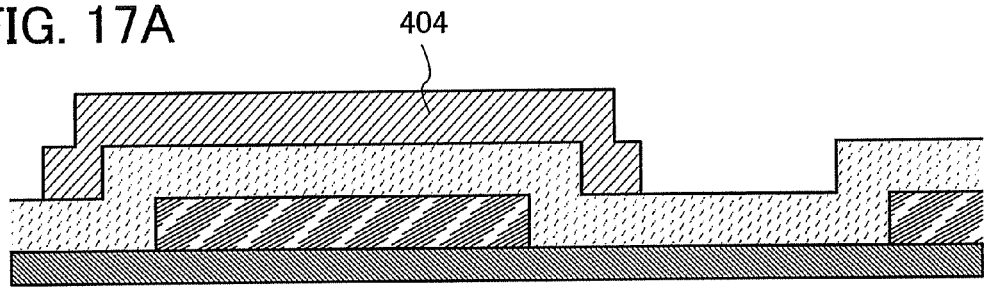
FIGS. 17A to 17C are cross-sectional views showing a method for manufacturing a semiconductor device of the present invention.

By passing a laser beam through the photomask 443, the zinc oxide film in a region in which the laser beam has been shielded by the light-shielding layer 442 is not sublimed and the island-shaped semiconductor film 404 is formed (see FIG. 17A). On the other hand, the zinc oxide film is sublimed by the laser beam which has passed through the region in which the light-shielding layer 442 is not formed.

In FIG. 16B, a zinc oxide film 449 formed on a light-transmitting substrate 448 is used as a source substrate. Here, the zinc oxide film 449 is formed to have a thickness of 10 nm to 50 nm.

As a photomask 447, light-shielding layers 446 formed on a light-transmitting substrate 445 are used. The light-shielding layers 446 are not formed in the region corresponding to the island-shaped semiconductor film 404 but formed so as to transmit a laser beam.

Next, the source substrate is provided between the gate insulating film 403 and the photomask 447 over the substrate 401, and the source substrate is irradiated with a laser beam through the photomask 447.

Thus, the zinc oxide film 449 is sublimed, and the zinc oxide film is transferred to the gate insulating film 403, whereby the island-shaped semiconductor film 404 is formed (see FIG. 17A).

Note that the island-shaped semiconductor film 404 may be formed not by the method described in FIGS. 16A and 16B, but by a droplet discharge method by which a layer having a predetermined shape is formed by discharging a droplet of a controlled composition through a fine hole. In addition, a printing method may be used. Furthermore, after a semiconductor layer is formed on the substrate by a CVD method, a PVD method, a coating method, or the like, the zinc oxide film is selectively etched by a photolithography step, and the island-shaped semiconductor film 404 may be formed.

Next, a region 405a which is either one of a source region and drain region and a region 405b which is the other one of the source region and the drain region are formed over the island-shaped semiconductor film 404.

As a photomask 453, light-shielding layers 452 are formed on a light-transmitting substrate 451. The light-shielding layers 452 are arranged so as to transmit a laser beam and are not provided in a region corresponding to the regions 405a and 405b.

Figure 17B:
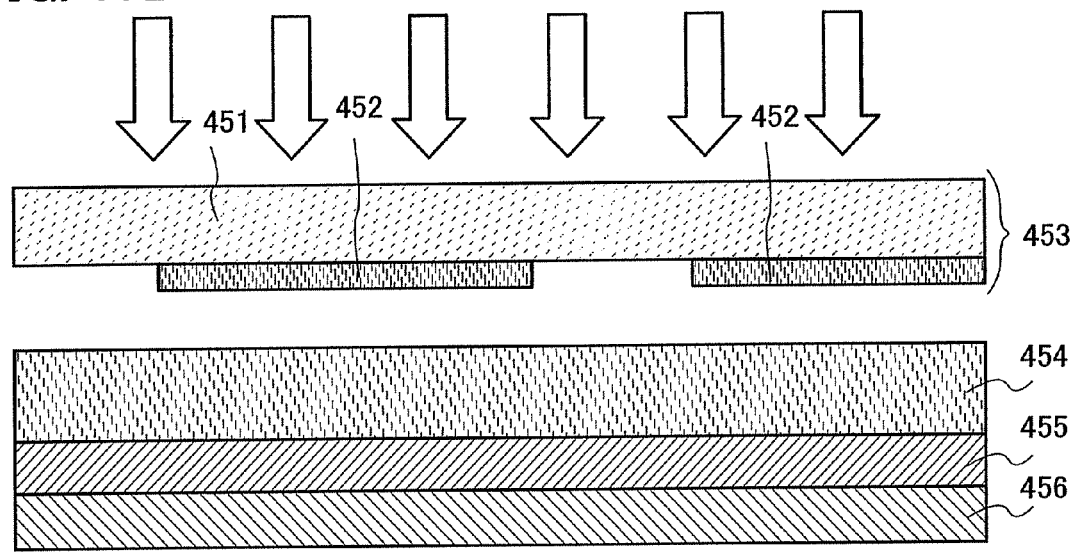
Figure 17B:
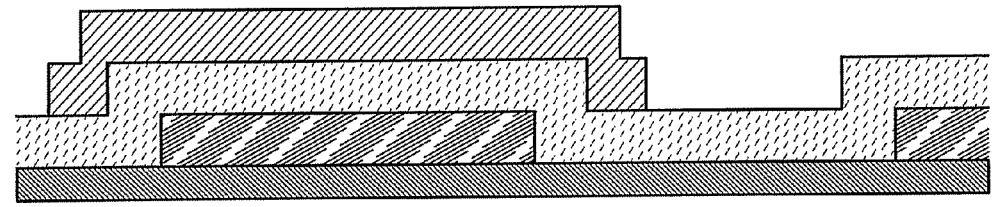

In addition, as a source substrate, a zinc oxide film 455 and a conductive semiconductor film 456, for example, an amorphous silicon film doped with phosphorus are formed on a light-transmitting substrate 454 (see FIG. 17B).

Figure 17C:
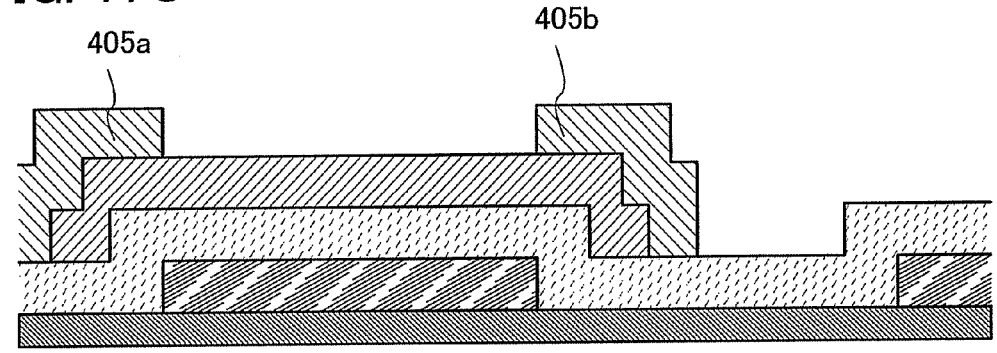

By laser beam irradiation, the zinc oxide film 455 is sublimed by the laser beam which has passed through the photomask 453, and the conductive semiconductor film 456 is transferred to the island-shape semiconductor film 404 and the gate insulating film 403, whereby the regions 405a and 405b are formed (see FIG. 17C).

The regions 405a and 405b may be formed by a droplet discharge method by which a layer having a predetermined shape is formed by discharging a droplet of a controlled composition through a fine hole. In addition, a printing method may be used. Furthermore, after a conductive semiconductor film is formed on the substrate by a CVD method, a PVD method, a coating method, or the like, the conductive semiconductor film is selectively etched by a photolithography step, and the regions 405a and 405b may be formed.

Next, a pixel electrode 406 is formed. The pixel electrode 406 may be formed of a similar material to the pixel electrode 308.

As a photomask 463, a light-shielding layer 462 is formed on a light-transmitting substrate 461. The light-shielding layer 462 is arranged so as to transmit a laser beam and is not provided in a region corresponding to the pixel electrode 406.

Figure 18A:
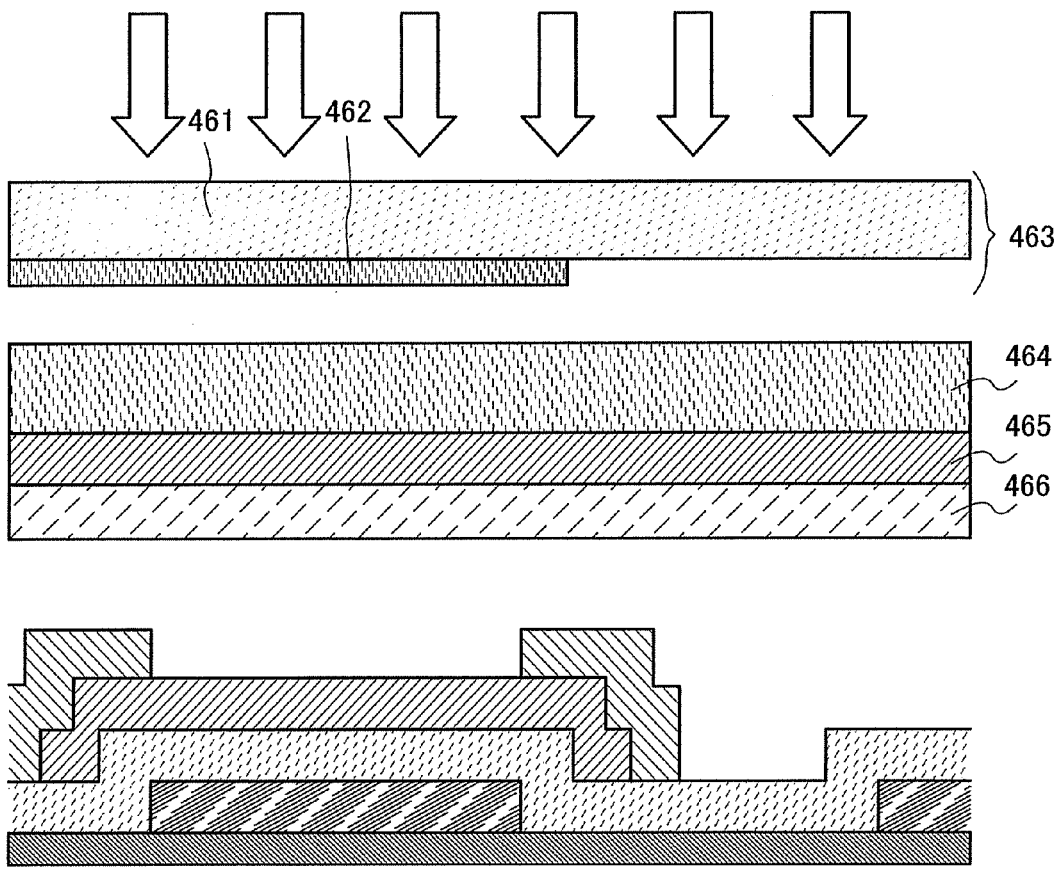
FIGS. 18A and 18B are cross-sectional views showing a method for manufacturing a semiconductor device of the present invention.
Figure 18B:
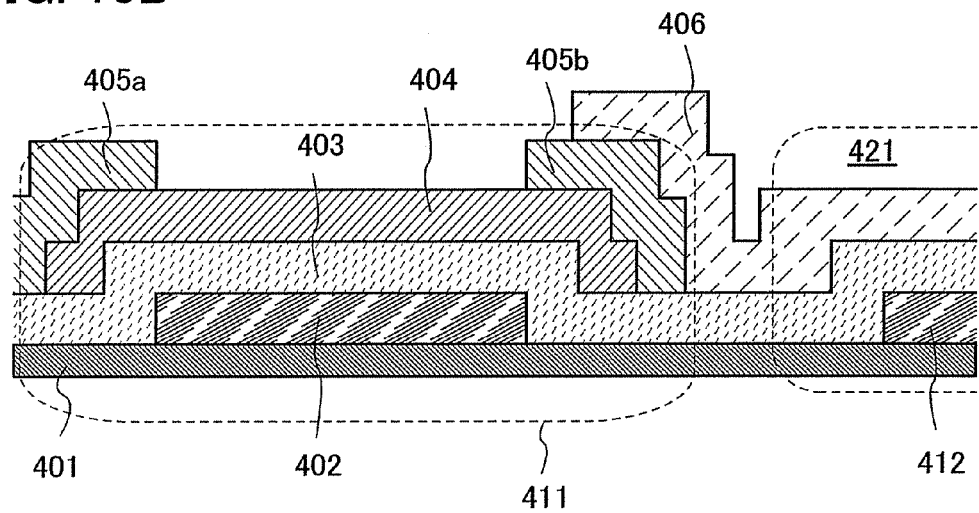

In addition, as a source substrate, a zinc oxide film 465 and a conductive film 466 are formed on a light-transmitting substrate 464 (see FIG. 18A).

As the conductive film 466, a light-transmitting conductive film or a reflective conductive film may be used. As a light-transmitting conductive film, a single-layer film formed of indium tin oxide (ITO), indium tin oxide containing silicon oxide (also referred to as ITSO), organic indium, organotin, zinc oxide, or titanium nitride; or a stacked-layer film of these can be used.

In addition, as the reflective conductive film, a single-layer film formed of tungsten (W), aluminum (Al), titanium (Ti), tantalum (Ta), silver (Ag), gold (Au), copper (Cu), or the like; or a multilayer film with a combination of these can be used.

Next, the source substrate is provided between the substrate 401 and the photomask 463, and the source substrate is irradiated with a laser beam through the photomask 463.

Thus, the zinc oxide film 465 is sublimed, and the conductive film 466 is transferred to the gate insulating film 403, the region 405a, and the region 405b, whereby the pixel electrode 406 is formed. As set forth above, a TFT 411 and a capacitor 421 are formed (see FIG. 18B).

Alternatively, the pixel electrode 406 may be formed by a droplet discharge method by which a layer having a predetermined shape is formed by discharging a droplet of a controlled composition through a fine hole. In addition, a printing method may be used. Furthermore, after a conductive layer is formed on the substrate by a CVD method, a PVD method, a coating method, or the like, the conductive layer is selectively etched by a photolithography step, and the pixel electrode 406 may be formed.

Note that a method by which a layer having a predetermined shape is formed by discharging a droplet of a controlled composition through a fine hole is referred to as a droplet discharge method.

In accordance with the above steps, a bottom gate TFT can be formed as a semiconductor element by a transfer method using a laser beam.

Embodiment Mode 3

In this embodiment mode, an example of a liquid crystal display device using a top gate ZnO-TFT will be described with reference to FIG. 5, and FIGS. 6A to 6C. Note that the portions that are the same as those in Embodiment Mode 1 are denoted by the same reference numerals.

Figure 5:
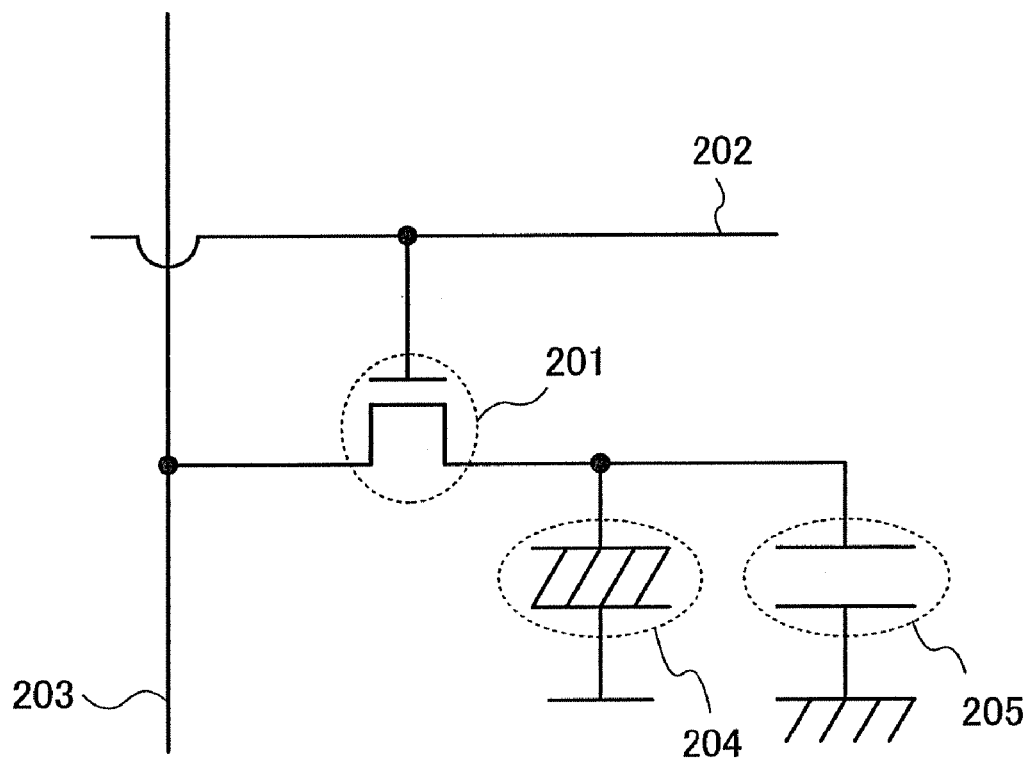
FIG. 5 is a circuit diagram of a liquid crystal display device of the present invention.

The liquid crystal display device shown in FIG. 5 includes a thin film transistor (TFT) 201, a gate line (gate wiring) 202, a data line (data wiring) 203, a liquid crystal element 204, and a capacitor 205.

First, over a substrate 211 and a base film 212, the thin film transistor 201 is formed based on the manufacturing step described in Embodiment Mode 1.

The thin film transistor 201 corresponds to the thin film transistor 309 of Embodiment Mode 1. An island-shaped semiconductor film 213, an electrode 206 which is either one of a source electrode and a drain electrode, an electrode 214 which is the other one of the source electrode and the drain electrode, a gate insulating film 215, and a gate electrode 207 in the thin film transistor 201 correspond to the island-shaped zinc oxide film 303, the electrode 304a, the electrode 304b, the gate insulating film 306, and the gate wiring 307 of Embodiment Mode 1, respectively.

Note that as the island-shaped semiconductor film 213, not only a zinc oxide film but also a mixed crystal semiconductor containing zinc oxide, a zinc compound semiconductor film such as zinc sulfide (ZnS), or an oxide semiconductor film can be used.

In addition, the electrode 206 may be formed as a wiring and be set as the data line 203. Alternatively, the electrode 206 and the data line 203 may be formed of different materials and in different steps and be electrically connected to each other.

In addition, the gate electrode 207 may be formed as a wiring and be set as the gate line 202. Alternatively, the gate electrode 207 and the gate line 202 may be formed of different materials and in different steps and be electrically connected to each other.

Figure 6A:
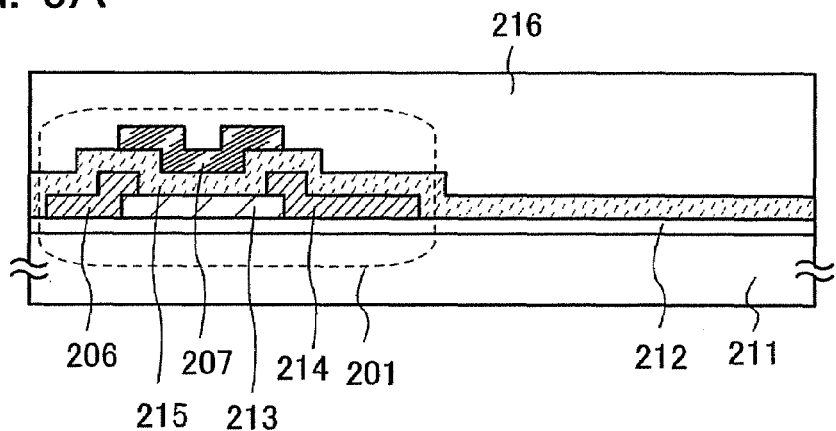
FIGS. 6A to 6C are cross-sectional views showing a method for manufacturing a semiconductor device of the present invention.
Figure 6B:
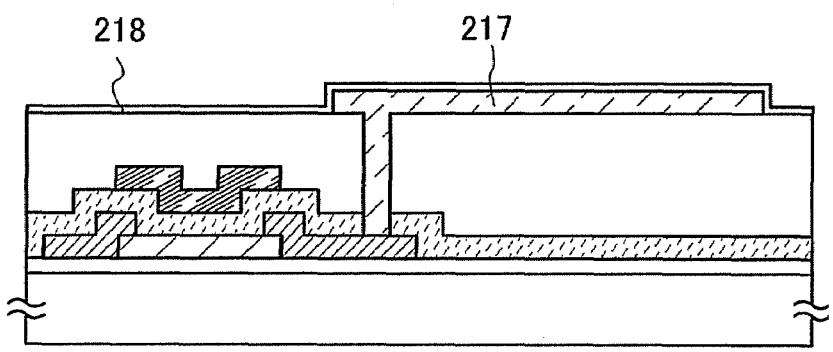
Figure 6C:
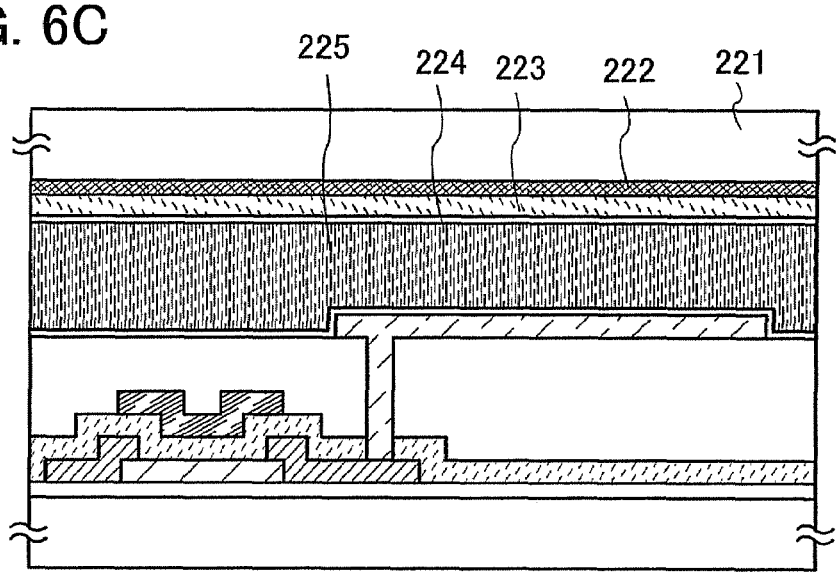

Then, an insulating film 216 which covers the TFT 201 is formed (see FIG. 6A). Here, by a coating method, a composition is applied and baked, whereby the insulating film 216 formed of polyimide is formed.

Next, part of the insulating film 216 is removed, and an opening is provided. Furthermore, a pixel electrode 217 is formed in the opening and on the surface of the insulating film 216.

A transmissive display device can be manufactured by using a light-transmitting material as the pixel electrode 217. In addition, a reflective display device can be manufactured by using a reflective material as the pixel electrode 217.

The pixel electrode 217 corresponds to the pixel electrode 308 of Embodiment Mode 1, and Embodiment Mode 1 is used for the details of a manufacturing method.

Besides, a semi-transmissive display device can be manufactured by forming each one pixel using the above-described light-transmitting material and reflective material, as the pixel electrode 217.

Next, an insulating film is formed by a printing method or a spin-coating method, so that an orientation film 218 is formed by a rubbing treatment. Note that the orientation film 218 can be formed by an oblique evaporation method.

Next, a sealant (not shown) having a closed loop shape is formed by a droplet discharge method in the peripheral region of the pixel portion in an opposing substrate 221 provided with an orientation film 224, a second pixel electrode (opposite electrode) 223, and a colored layer 222. The sealant may be mixed with a filler, and the opposing substrate 221 may be provided with a color filter, a shielding film (black matrix), or the like.

Next, a liquid crystal material is dropped to the inside of the closed loop made of the sealant by a dispenser technique (dropping technique). Then, the opposing substrate 221 and the substrate 211 are attached to each other in vacuum, and a liquid crystal layer 225 filled with the liquid crystal material is formed by using ultraviolet curing. Note that a dip technique (pumping technique), in which the liquid crystal material is injected by using a capillary phenomenon after attaching the opposing substrate to the substrate, can be used for the method for forming the liquid crystal layer 225 instead of the dispenser technique (dropping technique).

Then, a wiring substrate, typically an FPC (Flexible Printed Circuit), is attached to connection terminal portions of the gate line 202 and the data line 203 through a connecting conductive layer. In accordance with the above steps, the liquid crystal display device can be formed.

Note that a TN liquid crystal display device is described in this embodiment mode; however, the above-described process can be similarly used for other types of liquid crystal display devices. For example, this embodiment mode can be used for a liquid crystal display device of an in-plane switching system (IPS system) in which an electric field is applied parallel to a glass substrate to orient liquid crystal. Further, this embodiment mode can be used for a liquid crystal display device of a VA (Vertical Alignment) system.

Note that a protective circuit for preventing damage due to electrostatic discharge, typically a diode or the like, may be provided between the connection terminal and a data line or a gate line, or in the pixel portion. In this case, the protective circuit is manufactured through similar steps to those of the above-described TFT. The damage due to electrostatic discharge can be prevented by connecting a gate wiring layer of the pixel portion and a drain or source wiring layer of the diode.

According to the present invention, a composition such as a wiring which forms a display device can be formed into a desired shape. In addition, the number of complicated photolithography steps is reduced, and a display device can be formed through a simplified step; therefore, loss of materials and cost can be reduced. Thus, a display device with high performance and high reliability can be formed with high yield.

Embodiment Mode 4

In this embodiment mode, a light-emitting display panel which is formed using the present invention will be described with reference to FIGS. 7A to 7C, FIGS. 8A to 8E, FIGS. 9A to 9C, and FIGS. 10A to 10C.

Figure 7A:
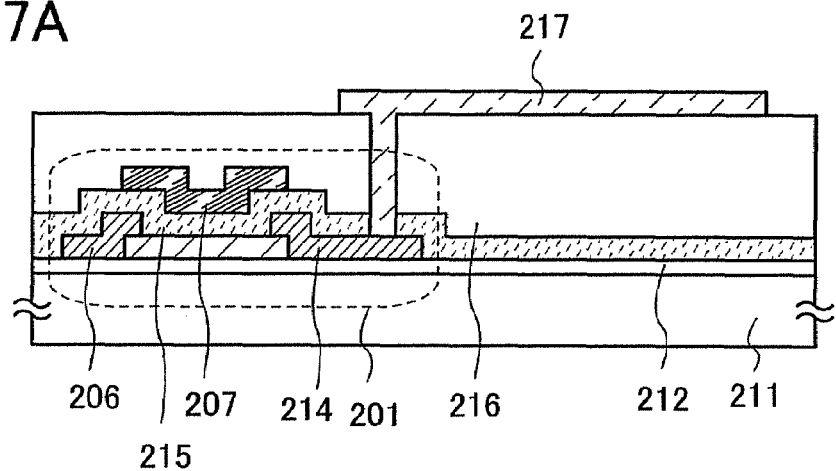
FIGS. 7A to 7C are cross-sectional views showing a method for manufacturing a semiconductor device of the present invention.
Figure 7B:
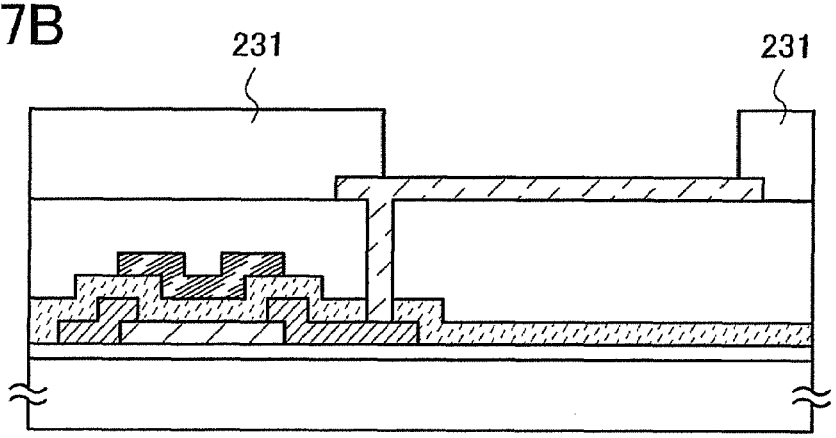

Based on the description in Embodiment Mode 3, steps up to and including the step for forming the pixel electrode 217 are performed (see FIG. 7A). Note that the portions that are the same as those in Embodiment Modes 1 and 2 are denoted by the same reference numerals.

Next, insulating films 231 which cover an end portion of the pixel electrode 217 are formed. Such insulating films 231 can be formed in such a way that an insulating film which is not shown in the drawing is formed over the insulating film 216 and the pixel electrode 217 and the insulating film over the pixel electrode 217 is removed.

Next, a layer 232 having a light-emitting substance is formed over an exposed portion of the pixel electrode 217 and part of the insulating films 231, and a second pixel electrode 233 is formed thereover. In accordance with the above steps, a light-emitting element 234 having the pixel electrode 217, the layer 232 having the light-emitting substance, and the pixel electrode 233 can be formed.

Here, a structure of the light-emitting element 234 is described.

A layer (hereinafter referred to as a light-emitting layer 343) which has a light-emitting function using an organic compound is formed over the layer 232 having the light-emitting substance so that the light-emitting element 234 functions as an organic EL element.

As an organic compound having a light-emitting property, for example, the following are given: 9,10-di(2-naphthyl)anthracene (abbreviation: DNA), 2-tert-butyl-9,10-di(2-naphthyl)anthracene (abbreviation: t-BuDNA), 4,4'-bis(2,2-diphenylvinyl)biphenyl (abbreviation: DPVBi), coumarin 30, coumarin 6, coumarin 545, coumarin 545T, perylene, rubrene, periflanthene, 2,5,8,11-tetra(tert-butyl)perylene (abbreviation: TBP), 9,10-diphenylanthracene (abbreviation: DPA), 5,12-diphenyltetracene, 4-(dicyanomethylene)-2-methyl-6-[p-(dimethylamino)styryl]-4H-pyran (abbreviation: DCM1), 4-(dicyanomethylene)-2-methyl-6-[2-(julolidine-9-yl)ethenyl]-4H-pyran (abbreviation: DCM2), 4-(dicyanomethylene)-2,6-bis[p-(dimethylamino)styryl]-4H-pyran (abbreviation: BisDCM), and the like. Moreover, compounds that phosphoresce such as the following can be given: bis[2-(4',6'-difluorophenyl)pyridinato-N,$C^2$](picolinato)iridium (abbreviation: FIrpic), bis {2-[3',5'-bis(trifluoromethyl)phenyl]pyridinato-N,$C^2$}(picolinato)iridium (abbreviation: Ir($CF_3$ppy)$_2$(pic)), tris(2-phenylpyridinato-N,$C^2$)iridium (abbreviation: Ir(ppy)$_3$), (acetylacetonato)bis(2-phenylpyridinato-N,$C^2$)iridium (abbreviation: Ir(ppy)$_2$(acac)), (acetylacetonato)bis[2-(2'-thienyl)pyridinato-N,$C^3$]iridium (abbreviation: Ir(thp)$_2$(acac)), (acetylacetonato)bis(2-phenylquinolinato-N,$C^2$)iridium (abbreviation: Ir(pq)$_2$(acac)), (acetylacetonato)bis[2-(2'-benzothienyl)pyridinato-N,$C^3$]iridium (abbreviation: Ir(btp)$_2$(acac)), and the like.

Figure 8A:
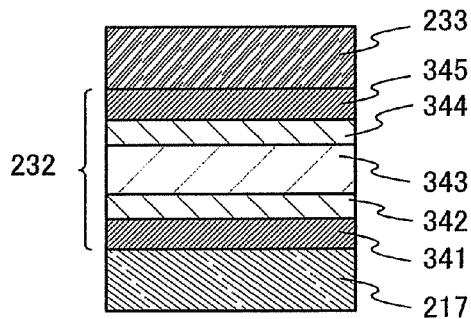
FIGS. 8A to 8E are cross-sectional views of semiconductor devices of the present invention.

As shown in FIG. 8A, the light-emitting element 234 may be formed over the first pixel electrode 217 by the layer 232 having the light-emitting material formed of a hole-injecting layer 341 formed with a hole-injecting material, a hole-transporting layer 342 formed with a hole-transporting material, the light-emitting layer 343 formed with an organic compound having a light-emitting property, an electron-transporting layer 344 formed with an electron-transporting material, and an electron-injecting layer 345 formed with an electron-injecting material; and the second pixel electrode 233.

As the hole-transporting material, phthalocyanine (abbreviation: $H_2Pc$), copper phthalocyanine (abbreviation: CuPc), and vanadyl phthalocyanine (VOPc) are given. Besides those, the following are given: 4,4',4''-tris(N,N-diphenylamino)triphenylamine (abbreviation: TDATA), 4,4',4''-tris[N-(3-methylphenyl)-N-phenylamino]triphenylamine (abbreviation: MTDATA), 1,3,5-tris[N,N-di(m-tolyl)amino]benzene (abbreviation: m-MTDAB), N,N'-diphenyl-N,N'-bis(3-methylphenyl)-1,1'-biphenyl-4,4'-diamine (abbreviation: TPD), 4,4'-bis[N-(1-naphthyl)-N-phenylamino]biphenyl (abbreviation: NPB), 4,4'-bis{N-[4-di(m-tolyl)amino]phenyl-N-phenylamino}biphenyl (abbreviation: DNTPD), 4,4'-bis[N-(4-biphenylyl)-N-phenylamino]biphenyl (abbreviation: BBPB), 4,4',4''-tri(N-carbazolyl)triphenylamine (abbreviation: TCTA), and the like. However, the present invention is not limited to these. Among the above-mentioned compounds, aromatic amine compounds typified by TDATA, MTDATA, m-MTDAB, TPD, NPB, DNTPD, BBPB, and TCTA are preferable as the organic compound because holes are generated more easily in those. The substances mentioned here are mainly ones that have a hole mobility of $10^{-6}$ $cm^2/V \cdot s$ or higher.

Besides the above-mentioned hole-transporting materials, as the hole-injecting material, a conductive compound with a high molecular weight which has been chemically doped, polyethylene dioxythiophene (abbreviation: PEDOT) doped with polystyrenesulfonate (abbreviation: PSS), polyaniline (abbreviation: PAni), or the like can be used. Moreover, a thin film of an inorganic semiconductor such as molybdenum oxide, vanadium oxide, or nickel oxide, or an ultrathin film of an inorganic insulator such as aluminum oxide ($Al_2O_3$) is also effective.

Here, as the electron-transporting material, one of the following metal complexes having a quinoline skeleton or a benzoquinoline skeleton, or the like can be used: tris(8-quinolinolato)aluminum (abbreviation: $Alq_3$), tris(4-methyl-8-quinolinolato)aluminum (abbreviation: $Almq_3$), bis(10-hydroxybenzo[h]-quinolinato)beryllium (abbreviation: $BeBq_2$), bis(2-methyl-8-quinolinolato)-4-phenylphenolato-aluminum (BAlq), or the like. Besides those, one of the following metal complexes having an oxazole-based ligand or a thiazole-based ligand, or the like can be used: bis[2-(2-hydroxyphenyl)benzoxazolato]zinc (abbreviation: $Zn(BOX)_2$), bis[2-(2-hydroxyphenyl)benzothiazolato]zinc (abbreviation: $Zn(BTZ)_2$), or the like. Furthermore, in addition to the metal complexes, 2-(4-biphenylyl)-5-(4-tert-butylphenyl)-1,3,4-oxadiazole (abbreviation: PBD), 1,3-bis[5-(p-tert-butylphenyl)-1,3,4-oxadiazole-2-yl]benzene (abbreviation: OXD-7), 3-(4-tert-butylphenyl)-4-phenyl-5-(4-biphenylyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), bathophenanthroline (abbreviation: BPhen), bathocuproin (abbreviation: BCP), or the like can also be used. The substances mentioned here are mainly ones that have an electron mobility of $10^{-6}$ cm$^2$/V·s or higher.

As the electron-injecting material, in addition to the above-mentioned electron-transporting materials, an ultrathin film of an insulator is often used; for example, an alkali metal halide such as LiF or CsF, an alkaline earth metal halide such as $CaF_2$, or an alkali metal oxide such as $Li_2O$. Moreover, an alkali metal complex such as lithium acetylacetonate (abbreviation: Li(acac)) or 8-quinolinolato-lithium (abbreviation: Liq) is also effective. Further, a material in which the above-mentioned electron-transporting material and a metal having a low work function such as Mg, Li, or Cs are mixed by co-evaporation or the like can be used.

Figure 8B:
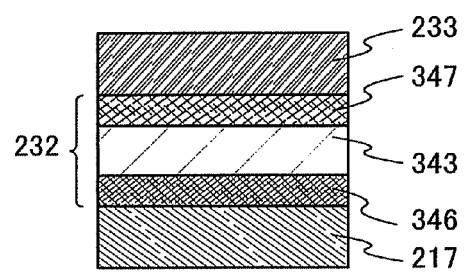

As shown in FIG. 8B, the light-emitting element 234 may be formed by the first pixel electrode 217; the layer 232 having the light-emitting material formed of a hole-transporting layer 346 formed with an organic compound and an inorganic compound having an electron-accepting property with respect to the organic compound, the light-emitting layer 343 formed with an organic compound having a light-emitting property, and an electron-transporting layer 347 formed with an inorganic compound having an electron-donating property with respect to the organic compound having the light-emitting property; and the second pixel electrode 233.

The hole-transporting layer 346 formed with an organic compound having a light-emitting property and an inorganic compound having an electron-accepting property with respect to the organic compound having the light-emitting property is formed by appropriately using the above-mentioned organic compound having the hole-transporting property as the organic compound. As the inorganic compound, any inorganic compound can be used as long as it is one in which electrons are easily accepted from the organic compound, and various metal oxides or metal nitrides can be used. In particular, an oxide of a transition metal belonging to any of Groups 4 to 12 of the periodic table of the elements is preferable because such an oxide is likely to have an electron-accepting property. Specifically, titanium oxide, zirconium oxide, vanadium oxide, molybdenum oxide, tungsten oxide, rhenium oxide, ruthenium oxide, zinc oxide, and the like are given. Among the metal oxides described above, an oxide of a transition metal belonging to any of Groups 4 to 8 of the periodic table of the elements is preferable because of its high electron-accepting property. In particular, vanadium oxide, molybdenum oxide, tungsten oxide, and rhenium oxide are preferable because they can be evaporated in vacuum and are easy to handle.

The electron-transporting layer 347 formed with an organic compound having a light-emitting property and an inorganic compound having an electron-donating property with respect to the organic compound having the light-emitting property is formed by appropriately using the above-mentioned organic compound having the electron-transporting property as the organic compound. As the inorganic compound, any inorganic compound can be used as long as it is one by which electrons are easily donated to the organic compound, and various metal oxides or metal nitrides can be used. In particular, an alkali metal oxide, an alkaline earth metal oxide, a rare earth metal oxide, an alkali metal nitride, an alkaline earth metal nitride, and a rare earth metal nitride are preferable because such oxides and nitrides are likely to have an electron-donating property. Specifically, lithium oxide, strontium oxide, barium oxide, erbium oxide, lithium nitride, magnesium nitride, calcium nitride, yttrium nitride, lanthanum nitride, and the like are given. In particular, lithium oxide, barium oxide, lithium nitride, magnesium nitride, and calcium nitride are preferable because they can be evaporated in vacuum and are easy to handle.

Since the electron-transporting layer 347 or the hole-transporting layer 346 formed with the organic compound having the light-emitting property and the inorganic compound has an excellent electron-injecting/transporting property, various materials can be used to form the first pixel electrode 217 and the second pixel electrode 233 without being restricted by the work function. Moreover, the driving voltage can be decreased.

In addition, as the layer 232 having the light-emitting substance, by having a layer which has a light-emitting function using an inorganic compound (hereinafter referred to as a light-emitting layer 349), the light-emitting element 234 functions as an inorganic EL element. The inorganic EL elements are classified according to their element structures into a dispersed inorganic EL element and a thin-film inorganic EL element. They are different in that the former includes a layer having a light-emitting substance in which particles of a light-emitting material are dispersed in a binder and the latter includes a layer having a light-emitting substance formed of a thin film of a light-emitting material; however, they are the same in that they both require that electrons be accelerated by a high electric field. Note that the mechanism of light emission to be obtained includes emission of light by donor-acceptor recombination which utilizes a donor level and an acceptor level and localized emission of light that utilizes inner-shell electron transition of metal ions. In general, it is often the case that the dispersed inorganic EL element performs the donor-acceptor recombination light emission and the thin-film inorganic EL element performs the localized light emission. Hereinafter, the structure of the inorganic EL element is described.

A light-emitting material which can be used in this embodiment mode includes a base material and an impurity element serving as a luminescent center. Light emission of various colors can be obtained by changing impurity elements that are contained. As a method for manufacturing a light-emitting material, various methods such as a solid phase method and a liquid phase method (coprecipitation method) can be used. In addition, a liquid phase method such as a spray pyrolysis method, a double decomposition method, a method by precursor pyrolysis, a reverse micelle method, a method in which one or more of these methods and high-temperature baking are combined, or a freeze-drying method can be used.

The solid phase method is a method by which a base material and an impurity element or a compound containing an impurity element are weighed out, mixed in a mortar, and made to react by being heated and baked in an electric furnace to make the impurity element contained in the base material. The baking temperature is preferably in the range of 700° C. to 1500° C. This is because solid phase reaction does not proceed when the temperature is too low and the base material decomposes when the temperature is too high. Note that the baking may be performed with the material in powder form, but the baking is preferably performed with the material in pellet form. The method requires baking at a relatively high temperature; however, it is a simple method. Therefore, the method provides good productivity and is suitable for mass production.

The liquid phase method (coprecipitation method) is a method by which a base material or a compound containing a base material is made to react in a solution with an impurity element or a compound containing an impurity element and the reactant is baked after being dried. Particles of the light-emitting material are uniformly distributed, the particle size is small, and the reaction proceeds even at a low baking temperature.

As the base material used for a light-emitting material of the inorganic EL element, a sulfide, an oxide, or a nitride can be used. As a sulfide, for example, zinc sulfide (ZnS), cadmium sulfide (CdS), calcium sulfide (CaS), yttrium sulfide ($Y_2S_3$), gallium sulfide ($Ga_2S_3$), strontium sulfide (SrS), barium sulfide (BaS), or the like can be used. As an oxide, for example, zinc oxide (ZnO), yttrium oxide ($Y_2O_3$), or the like can be used. As a nitride, for example, aluminum nitride (AlN), gallium nitride (GaN), indium nitride (InN), or the like can be used. Further, zinc selenide (ZnSe), zinc telluride (ZnTe), or the like can also be used. The base material may be a ternary mixed crystal such as calcium gallium sulfide ($CaGa_2S_4$), strontium gallium sulfide ($SrGa_2S_4$), or barium gallium sulfide ($BaGa_2S_4$).

As the luminescent center of localized light emission, manganese (Mn), copper (Cu), samarium (Sm), terbium (Tb), erbium (Er), thulium (Tm), europium (Eu), cerium (Ce), praseodymium (Pr), or the like can be used. Note that a halogen element such as fluorine (F) or chlorine (Cl) may be added for charge compensation.

On the other hand, as the luminescent center of donor-acceptor recombination light emission, a light-emitting material which contains a first impurity element forming a donor level and a second impurity element forming an acceptor level can be used. As the first impurity element, for example, fluorine (F), chlorine (Cl), aluminum (Al), or the like can be used. As the second impurity element, for example, copper (Cu), silver (Ag), or the like can be used.

In the case of synthesizing the light-emitting material of donor-acceptor recombination light emission by a solid phase method, a base material, a first impurity element or a compound containing a first impurity element, and a second impurity element or a compound containing a second impurity element are separately weighed out, mixed in a mortar, and then heated and baked in an electric furnace. As the base material, the above-mentioned base material can be used. As the first impurity element or the compound containing the first impurity element, for example, fluorine (F), chlorine (Cl), aluminum sulfide ($Al_2S_3$), or the like can be used. As the second impurity element or the compound containing the second impurity element, for example, copper (Cu), silver (Ag), copper sulfide ($Cu_2S$), silver sulfide ($Ag_2S$), or the like can be used. The baking temperature is preferably in the range of 700° C. to 1500° C. This is because solid phase reaction does not proceed when the temperature is too low and the base material decomposes when the temperature is too high. Note that the baking may be performed with the material in powder form, but the baking is preferably performed with the material in pellet form.

As the impurity element when a solid phase reaction is utilized, a compound that contains the first impurity element and the second impurity element may be used. In this case, the impurity element is easily diffused and the solid phase reaction easily proceeds, so that a uniform light-emitting material can be obtained. Furthermore, a high-purity light-emitting material can be obtained because an unnecessary impurity element is not mixed into the material that is used. As the compound that contains the first impurity element and the second impurity element, for example, copper chloride (CuCl), silver chloride (AgCl), or the like can be used.

Note that the concentration of the impurity element with respect to that of the base material may be in the range of 0.01 atomic % to 10 atomic %, preferably 0.05 atomic % to 5 atomic %.

Figure 8C:
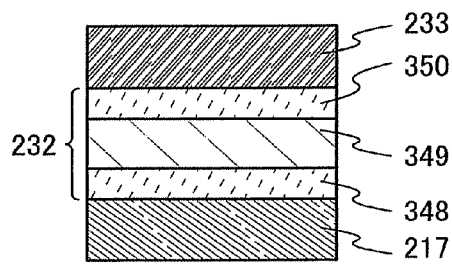

FIG. 8C shows a cross section of an inorganic EL element formed of the layer 232 having the light-emitting substance, which includes a first insulating layer 348, the light-emitting layer 349, and a second insulating layer 350.

For the thin-film inorganic EL element, the light-emitting layer 349 is a layer containing the above-described light-emitting material, which can be formed by a vacuum evaporation method such as a resistance heating evaporation method or an electron beam evaporation (EB evaporation) method, a physical vapor deposition (PVD) method such as a sputtering method, a chemical vapor deposition (CVD) method such as a metal organic CVD method or a low-pressure hydride transport CVD method, an atomic layer epitaxy (ALE) method, or the like.

There are no particular limitations on the first insulating layer 348 and the second insulating layer 350, but they preferably have high withstand voltage and dense film quality. Furthermore, they preferably have a high dielectric constant. For example, a film of silicon oxide ($SiO_2$), yttrium oxide ($Y_2O_3$), titanium oxide ($TiO_2$), aluminum oxide ($Al_2O_3$), hafnium oxide ($HfO_2$), tantalum oxide ($Ta_2O_5$), barium titanate ($BaTiO_3$), strontium titanate ($SrTiO_3$), lead titanate ($PbTiO_3$), silicon nitride ($Si_3N_4$), zirconium oxide ($ZrO_2$), or the like, a film of a mixture of one or more of these, or a stacked layer of two or more kinds can be used. The first insulating layer 348 and the second insulating layer 350 can be formed by sputtering, evaporation, CVD, or the like. Although there are no particular limitations on the thickness, it is preferably in the range of 10 nm to 1000 nm. Note that the light-emitting element of this embodiment mode does not necessarily require hot electrons; therefore, it can be formed into a thin film and has an advantage in that driving voltage is reduced. The light-emitting element preferably has a thickness of 500 nm or less, more preferably, 100 nm or less.

Note that although not shown, a buffer layer may be provided between the light-emitting layer 349 and the insulating layer 348 and between the light-emitting layer 349 and the insulating layer 350; or between the light-emitting layer 349 and the pixel electrode 217 and between the light-emitting layer 349 and the pixel electrode 233. This buffer layer facilitates carrier injection and functions to suppress mixing of both layers. Although there are no particular limitations on a material of the buffer layer, for example, the base material of the light-emitting layer such as ZnS, ZnSe, ZnTe, CdS, SrS, or BaS; CuS or $Cu_2S$; or an alkali halide such as LiF, $CaF_2$, $BaF_2$, or $MgF_2$ can be used.

Figure 8D:
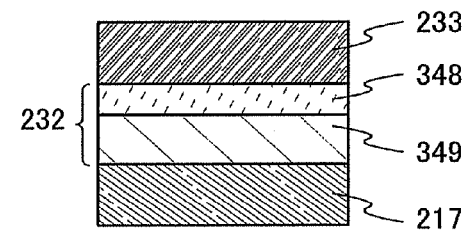

In addition, as shown in FIG. 8D, the layer 232 having the light-emitting substance may be formed of the light-emitting layer 349 and the first insulating layer 348. In this case, in FIG. 8D, the case in which the first insulating layer 348 is provided between the second pixel electrode 233 and the light-emitting layer 349 is shown. Note that the first insulating layer 348 may be provided between the first pixel electrode 217 and the light-emitting layer 349.

Furthermore, the layer 232 having the light-emitting substance may be formed of just the light-emitting layer 349. That is, the light-emitting element 234 may be formed of the first pixel electrode 217, the layer 232 having the light-emitting substance, and the second pixel electrode 233.

For the dispersed inorganic EL element, a particulate light-emitting material is dispersed in a binder to form a film-shaped layer having a light-emitting substance. When a particle having a desired size cannot be sufficiently obtained by a method for manufacturing a light-emitting material, the material may be processed into particles by being crushed in a mortar or the like. The binder is a substance for fixing a particulate light-emitting material in a dispersed manner and holding the material in shape as the layer having the light-emitting substance. The light-emitting material is uniformly dispersed and fixed in the layer having the light-emitting substance by the binder.

For the dispersed inorganic EL element, the layer having the light-emitting substance can be formed by a droplet discharge method by which the layer having the light-emitting substance can be selectively formed, a printing method (such as screen printing or off-set printing), a coating method such as a spin-coating method, a dipping method, a dispenser method, or the like. There are no particular limitations on the thickness, but it is preferably in the range of 10 nm to 1000 nm. In addition, in the layer having the light-emitting substance containing the light-emitting material and the binder, the ratio of the light-emitting material is preferably in the range of 50 wt % to 80 wt %.

Figure 8E:
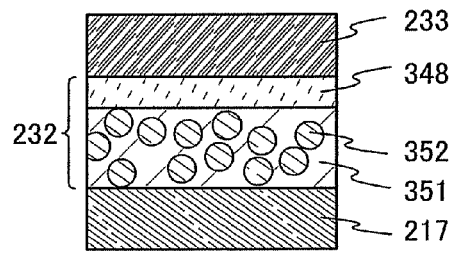

An element shown in FIG. 8E includes the first pixel electrode 217, the layer 232 having the light-emitting substance, and the second pixel electrode 233. The layer 232 having the light-emitting substance is formed of a light-emitting layer in which light-emitting materials 352 are dispersed in a binder 351, and the insulating layer 348. Note that although the insulating layer 348 comes into contact with the second pixel electrode 233 in FIG. 8E, the insulating layer 348 may come into contact with the first pixel electrode 217. In addition, the element may include an insulating layer that comes into contact with the first pixel electrode 217 and the second pixel electrode 233. Further, the element need not have an insulating layer which comes into contact with the first pixel electrode 217 and the second pixel electrode 233.

As the binder which can be used in this embodiment mode, an organic material or an inorganic material, or a mixed material of an organic material and an inorganic material can be used. As an organic material, a polymer having a relatively high dielectric constant, such as a cyanoethyl cellulose resin, or a resin such as polyethylene, polypropylene, a polystyrene resin, a silicone resin, an epoxy resin, or vinylidene fluoride can be used. Alternatively, a heat resistant compound with a high molecular weight such as aromatic polyamide or polybenzimidazole, or a siloxane resin may be used. Note that the siloxane resin corresponds to a resin that contains a Si—O—Si bond. Siloxane includes a skeleton formed from a bond of silicon (Si) and oxygen (O). An organic group containing at least hydrogen (for example, an alkyl group or aromatic hydrocarbon) or a fluoro group may be used for a substituent, or an organic group containing at least hydrogen and a fluoro group may be used for substituents. Alternatively, a resin material such as a vinyl resin such as polyvinyl alcohol or polyvinyl butyral, a phenol resin, a novolac resin, an acrylic resin, a melamine resin, a urethane resin, or an oxazole resin (polybenzoxazole) may be used. In addition, a photo-curing resin or the like can be used. A dielectric constant can be adjusted by appropriately mixing fine particles of a material that has a high dielectric constant such as barium titanate ($BaTiO_3$), strontium titanate ($SrTiO_3$), or the like into the above resin.

As an inorganic material used in the binder, a material selected from substances containing inorganic materials can be used, such as silicon oxide ($SiO_x$), silicon nitride ($SiN_x$), silicon containing oxygen and nitrogen, aluminum nitride (AlN), aluminum containing oxygen and nitrogen, aluminum oxide ($Al_2O_3$), titanium oxide ($TiO_2$), $BaTiO_3$, $SrTiO_3$, lead titanate ($PbTiO_3$), potassium niobate ($KNbO_3$), lead niobate ($PbNbO_3$), tantalum oxide ($Ta_2O_5$), barium tantalate ($BaTa_2O_6$), lithium tantalate ($LiTaO_3$), yttrium oxide ($Y_2O_3$), zirconium oxide ($ZrO_2$), or ZnS. The dielectric constant of the layer having the light-emitting substance including the light-emitting material and the binder can be controlled by making an organic material contain an inorganic material with a high dielectric constant (by addition or the like), so that the dielectric constant can be increased.

In a manufacturing step, a light-emitting material is dispersed in a solution including a binder. As a solvent of the solution including the binder that can be used in this embodiment mode, a solvent in which a binder material is soluble and which can produce a solution having a viscosity suitable for a method for forming the light-emitting layer (various wet processes) and a desired thickness may be selected appropriately. An organic solvent or the like can be used. In the case of using, for example, a siloxane resin as the binder, propylene glycol monomethyl ether, propylene glycol monomethyl ether acetate (also referred to as PGMEA), 3-methoxy-3-methyl-1-butanol (also referred to as MMB), or the like can be used.

Although the inorganic EL light-emitting element can emit light by application of a voltage between a pair of electrodes with a layer having a light-emitting substance interposed therebetween, it can operate by either DC drive or AC drive.

For example, a light-emitting element which displays a red color may be formed by the following method. A 125-nm-thick ITO layer containing silicon oxide is formed as the first pixel electrode 217. In addition, the layer 232 having the light-emitting substance is formed by stacking DNTPD formed at a thickness of 50 nm, NPB formed at a thickness of 10 nm, NPB doped with bis[2,3-bis(4-fluorophenyl)quinoxalinato]iridium(acetylacetonate) (abbreviation: Ir(Fdpq)$_2$(acac)) which is formed at a thickness of 30 nm, $Alq_3$ formed at a thickness of 30 nm, $Alq_3$ formed at a thickness of 30 nm, and LiF formed at a thickness of 1 nm. A 200-nm-thick Al layer is formed as the second pixel electrode 233.

In addition, when a light-emitting element which displays a green color is formed, first, a 125-nm-thick ITO layer containing silicon oxide is formed as the first pixel electrode 217. In addition, the layer 232 having the light-emitting substance is formed by stacking DNTPD formed at a thickness of 50 nm, NPB formed at a thickness of 10 nm, $Alq_3$ doped with coumarin 545T (C545T) which is formed at a thickness of 40 nm, $Alq_3$ formed at a thickness of 30 nm, and LiF formed at a thickness of 1 nm. A 200-nm-thick Al layer is formed as the second pixel electrode 233.

In addition, as a light-emitting element which displays a blue color, a 125-nm-thick ITO layer containing silicon oxide is formed as the first pixel electrode 217. In addition, the layer 232 having the light-emitting substance is formed by stacking DNTPD formed at a thickness of 50 nm, NPB formed at a thickness of 10 nm, 9-[4-(N-carbazolyl)]phenyl-10-phenylanthracene (abbreviation: CzPA) doped with 2,5,8,11-tetra(tert-butyl)perylene (abbreviation: TBP) which is formed at a thickness of 30 nm, $Alq_3$ formed at a thickness of 30 nm, and LiF formed at a thickness of 1 nm. A 200-nm-thick Al layer is formed as the second pixel electrode 233.

In addition, a protective film is preferably formed over the second pixel electrode 233.

Then, a wiring substrate, typically an FPC (Flexible Printed Circuit), is attached to connection terminal portions of a scanning line and a signal line through a connecting conductive layer. In accordance with the above steps, the light-emitting display panel can be formed.

Note that a protective circuit for preventing damage due to electrostatic discharge, typically a diode or the like, may be provided between the connection terminal and a source wiring (gate wiring), or in the pixel portion.

Figure 7C:
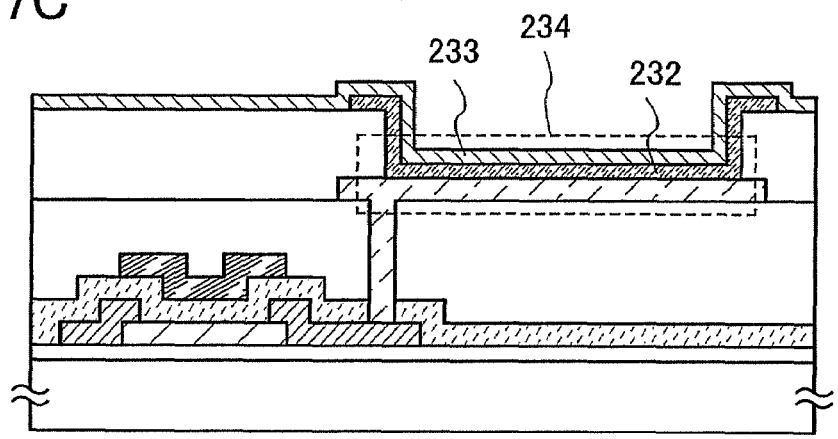

Here, in the light-emitting display panel having the light-emitting element shown in FIG. 7C and FIGS. 8A and 8B, the case where light is emitted toward the substrate 211 side, in other words, the case of bottom emission, is described with reference to FIG. 9A.

Figure 9A:
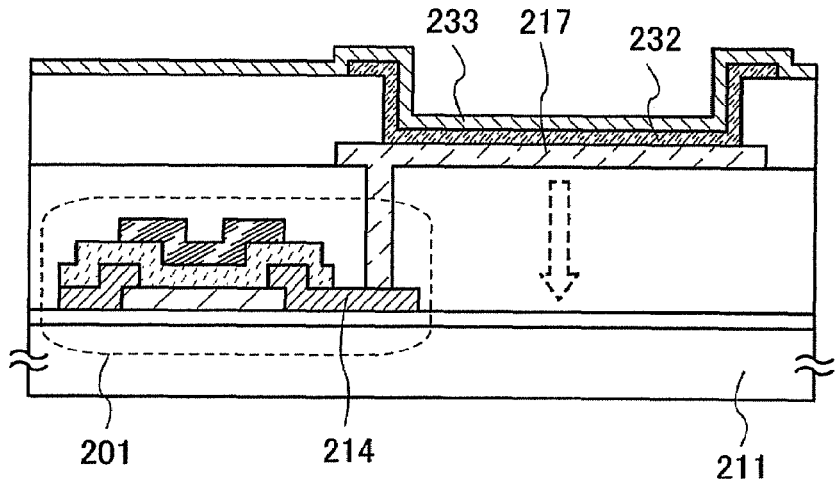
FIGS. 9A to 9C are cross-sectional views showing a method for manufacturing a semiconductor device of the present invention.

In the structure shown in FIG. 9A, the first pixel electrode 217 formed of a light-transmitting conductive layer, which comes into contact with the electrode 214 which is the other one of the source electrode and the drain electrode so as to be electrically connected to the thin film transistor 201, the layer 232 having the light-emitting substance, and the second pixel electrode 233 formed of a light-shielding conductive layer or a reflective conductive layer are sequentially stacked. The substrate 211 through which light passes is required to transmit at least visible light.

Next, the case where light is emitted toward the side opposite to the substrate 211, in other words, the case of top emission, is described with reference to FIG. 9B. The thin film transistor 201 can be formed in a similar manner to how the above-described thin film transistor is formed.

Figure 9B:
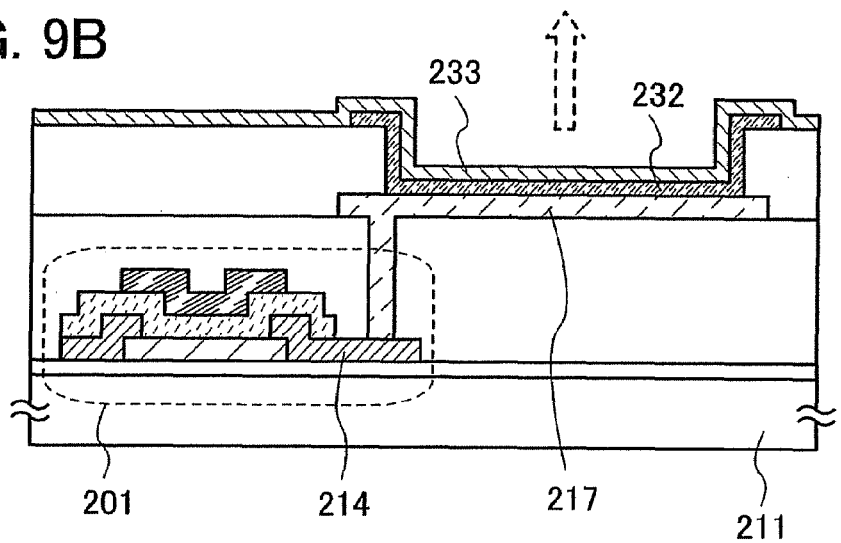

In the structure shown in FIG. 9B, the electrode 214 which is the other one of the source electrode and the drain electrode to be electrically connected to the thin film transistor 201 comes into contact with the first pixel electrode 217 formed of a light-shielding conductive layer or a reflective conductive layer, and the electrode 214 and the first pixel electrode 217 are electrically connected to each other. The first pixel electrode 217 formed of the light-shielding conductive layer or the reflective conductive layer, the layer 232 having the light-emitting substance, and the second pixel electrode 233 formed of a light-transmitting conductive layer are sequentially stacked.

The first pixel electrode 217 formed of the light-shielding conductive layer or the reflective conductive layer is a light-shielding metal layer or a reflective metal layer and reflects light, which is emitted from a light-emitting element, upward as indicated by an arrow. Note that a light-transmitting conductive layer may be formed over the first pixel electrode 217 formed of the light-shielding conductive layer or the reflective conductive layer.

Since light generated in the light-emitting element is emitted through the second pixel electrode 233 formed of the light-transmitting conductive layer, the light-transmitting conductive layer is formed using a material which transmits at least visible light.

Figure 9C:
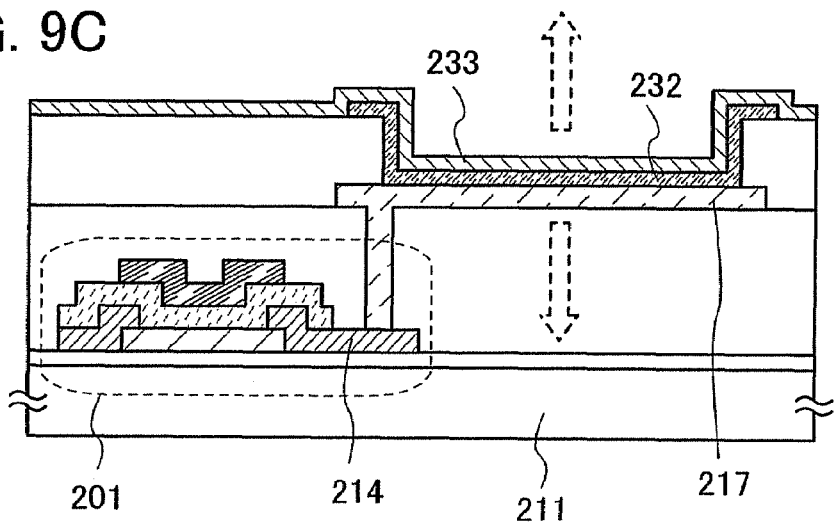

Next, the case where light is emitted through both the substrate 211 side and an opposite side, in other words, the case of dual emission, is described with reference to FIG. 9C. The electrode 214 which is the other one of the source electrode and the drain electrode to be electrically connected to the thin film transistor 201 is electrically connected to the first pixel electrode 217 formed of the first light-transmitting conductive layer. The first pixel electrode 217 formed of the first light-transmitting conductive layer, the layer 232 having the light-emitting substance, and the second pixel electrode 233 formed of a second light-transmitting conductive layer are sequentially stacked.

At this time, when both the first light-transmitting conductive layer and the second light-transmitting conductive layer are formed of a material which transmits at least visible light or formed to have such thicknesses that light can be transmitted, the dual emission is realized. In this case, an insulating layer and the substrate 211 through which light passes also need to transmit at least visible light.

Here, a pixel circuit of a light-emitting display panel having the above-described light-emitting element and an operational structure thereof are described with reference to FIGS. 10A to 10C.

For the operational structure of the light-emitting display panel in which video signals are digital, there is a structure in which video signals to be inputted to a pixel are regulated by voltage and a structure in which they are regulated by current. As the structure in which video signals are regulated by voltage, there is one where voltage applied to a light-emitting element is constant (CVCV) and one where current applied to the light-emitting element is constant (CVCC). Also, as the structure in which video signals are regulated by current, there is one where voltage applied to the light-emitting element is constant (CCCV) and one where current applied to the light-emitting element is constant (CCCC). This embodiment mode describes a pixel of a CVCV operation with reference to FIGS. 10A and 10B. Further, a pixel of a CVCC operation is described with reference to FIG. 10C.

Figure 10A:
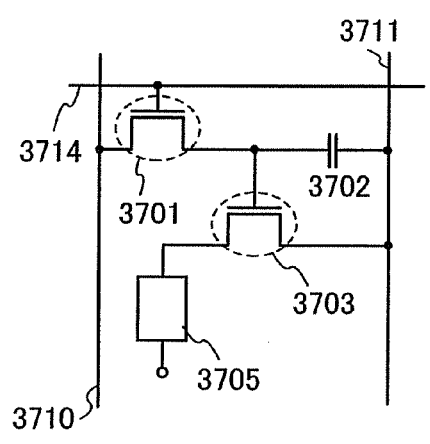
FIGS. 10A to 10C are circuit diagrams of a light-emitting element of the present invention.
Figure 10B:
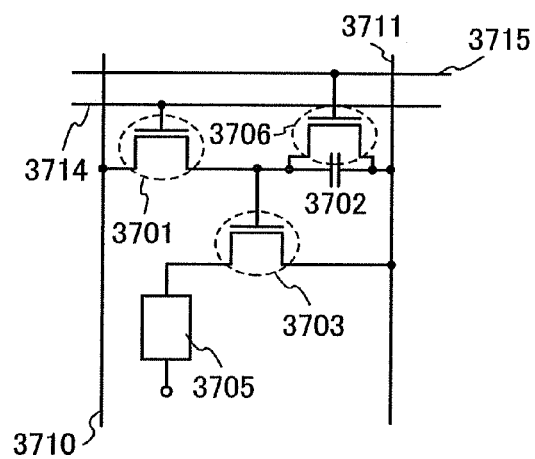
Figure 10C:
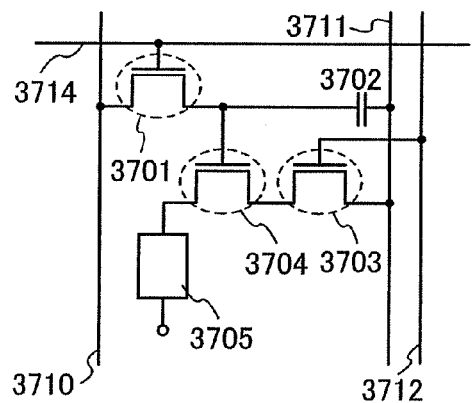

In the pixel shown in each of FIGS. 10A and 10B, a signal line 3710 and a power source line 3711 are arranged in a column direction and a scanning line 3714 is arranged in a row direction. Also, a switching TFT 3701, a driving TFT 3703, a capacitor 3702, and a light-emitting element 3705 are included.

Note that the switching TFT 3701 and the driving TFT 3703 are operated in a linear region when they are turned on. Also, the driving TFT 3703 has a role of controlling whether voltage is applied to the light-emitting element 3705. It is favorable in terms of a manufacturing step if both TFTs have the same conductivity type. Also, as the driving TFT 3703, a depletion type TFT may be used in addition to an enhancement type TFT. Further, a ratio (W/L) of a channel width W and a channel length L of the driving TFT 3703 is preferably 1 to 1000, even though it depends on the mobility of the TFT. As W/L gets larger, an electrical property of the TFT is improved.

In the pixel shown in each of FIGS. 10A and 10B, the switching TFT 3701 controls input of video signals to the pixel, and when the switching TFT 3701 is turned on, video signals are inputted inside the pixel. Then, voltage of the video signals is retained in the capacitor 3702.

In FIG. 10A, when the power source line 3711 is Vss and an opposite electrode of the light-emitting element 3705 is Vdd, the opposite electrode of the light-emitting element is an anode, and an electrode connected to the driving TFT 3703 is a cathode. In this case, luminance irregularity due to variations in the characteristics of the driving TFT 3703 can be suppressed.

In FIG. 10A, when the power source line 3711 is Vdd and the opposite electrode of the light-emitting element 3705 is Vss, the opposite electrode of the light-emitting element is a cathode, and the electrode connected to the driving TFT 3703 is an anode. In this case, by inputting video signals having a higher voltage than Vdd to the signal line 3710, voltage of the video signals is retained in the capacitor 3702 and the driving TFT 3703 is operated in the linear region; consequently, luminance irregularity due to variations in the characteristics of the TFT can be improved.

The pixel shown in FIG. 10B has the same pixel structure as the one shown in FIG. 10A except that, in FIG. 10B, a TFT 3706 and a scanning line 3715 are added.

The TFT 3706 being turned on or off is controlled by the newly placed scanning line 3715. When the TFT 3706 is turned on, a charge retained in the capacitor 3702 is discharged, and the driving TFT 3703 is turned off. In other words, according to a placement of the TFT 3706, a state in which current does not flow to the light-emitting element 3705 can be created forcefully. Therefore, the TFT 3706 can be called an erasing TFT. Consequently, in the structure in FIG. 10B, a duty ratio of light emission can be improved since a lighting period can be started at the same time as or right after the start of a writing period, without waiting for signals to be written to all pixels.

In a pixel having the above-mentioned operational structure, the amount of current of the light-emitting element 3705 can be determined by the driving TFT 3703 which operates in the linear region. By the above-mentioned structure, variations in the characteristics of TFTs can be suppressed, luminance irregularity of light-emitting elements due to the variations in the characteristics of the TFTs can be improved, and a display device with improved image quality can be provided.

Next, a pixel of a CVCC operation is described with reference to FIG. 10C. The pixel shown in FIG. 10C has the pixel structure shown in FIG. 10A, which is provided with a power source line 3712 and a current control TFT 3704. Note that in the pixel shown in FIG. 10C, a gate electrode of the driving TFT 3703 may be connected to the power source line 3712 arranged in a column direction.

Note that the switching TFT 3701 operates in the linear region, and the driving TFT 3703 operates in a saturation region. Also, the driving TFT 3703 has a role of controlling the amount of current flowing to the light-emitting element 3705, and the current control TFT 3704 operates in the saturation region and has a role of controlling the supply of current to the light-emitting element 3705.

Note that in the pixels shown in FIGS. 10A and 10B, CVCC operations are also possible. Also, for a pixel having the operational structure shown in FIG. 10C, similarly to those of FIG. 10A and 10B, Vdd and Vss can be appropriately changed depending on the direction in which current of a light-emitting element flows.

In a pixel having the above-mentioned structure, since the current control TFT 3704 operates in the linear region, a small shift in Vgs of the current control TFT 3704 does not have an effect on the amount of current of the light-emitting element 3705. In other words, the amount of current of the light-emitting element 3705 can be determined by the driving TFT 3703 which operates in the saturation region. By the above-mentioned structure, luminance irregularity of light-emitting elements due to variations in the characteristics of TFTs can be improved, and a display device with improved image quality can be provided.

In particular, when a thin film transistor having an amorphous semiconductor or the like is formed, variations in the characteristics of a TFT can be reduced when the area of a semiconductor film of a driving TFT is increased, which is preferable. In addition, in the pixels shown in FIGS. 10A and 10B, since the number of TFTs is small, an aperture ratio can be increased.

Note that, although a structure in which the capacitor 3702 is provided is shown, the present invention is not limited thereto, and when the capacity for retaining video signals can be covered by a gate capacitance, the capacitor 3702 need not be provided.

In addition, a circuit which corrects a threshold value may be provided in the pixel or in the periphery of the pixel so as to suppress a shift in a threshold value of a thin film transistor.

By such an active matrix light-emitting device, when the pixel density is increased, driving at low voltage is possible since a TFT is provided in each pixel, and this is considered to be advantageous. On the other hand, a passive matrix light-emitting device can also be formed. In the passive matrix light-emitting device, since a TFT is not provided in each pixel, a high aperture ratio can be obtained.

Further, in a display device of the present invention, there are no particular limitations on the method for driving of a screen display, and for example, a dot sequential driving method, a line sequential driving method, an area sequential driving method, or the like may be used. Typically, the line sequential driving method is used, and a time division gray scale driving method or an area gray scale driving method may be used, as appropriate. Further, video signals inputted to a source line of the display device may be analog signals or digital signals, and a driver circuit and the like may be designed appropriately according to the video signals.

As described above, various pixel circuits can be used for the light-emitting display panel of the present invention.

Embodiment Mode 5

In this embodiment mode, a method by which a bottom gate TFT and a pixel electrode are formed, which is different from the method described in Embodiment Mode 2, will be described with reference to FIGS. 19A and 19B, and FIGS. 20A to 20C.

First, based on the description in Embodiment Mode 2, steps up to and including the step for forming the gate insulating film shown in FIG. 15C are performed. Note that in FIG. 20A, a substrate 501, a gate electrode 502, and a gate insulating film 503 correspond to the substrate 401, the gate electrode 402, and the gate insulating film 403, respectively, in FIG. 15C. Furthermore, a semiconductor film 531 is formed over the gate insulating film 503 (see FIG. 20A).

However, the semiconductor film 531 is formed of any one of zinc oxide (ZnO), a mixed crystal semiconductor containing zinc oxide, a zinc compound semiconductor film containing zinc sulfide (ZnS), and an oxide semiconductor film. In this embodiment mode, zinc oxide is used.

Figure 20A:
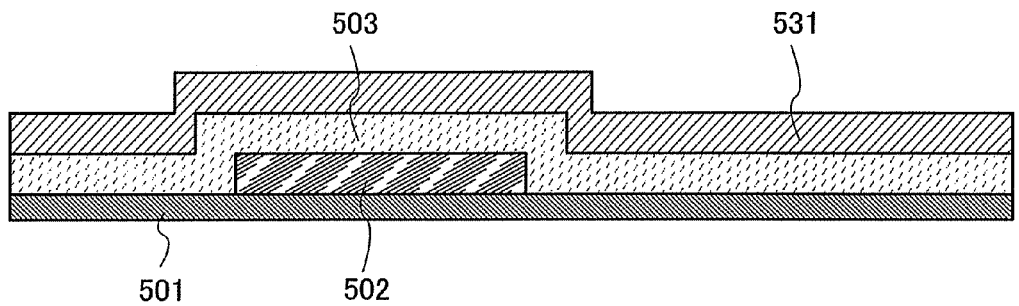
FIGS. 20A to 20C are cross-sectional views showing a method for manufacturing a semiconductor device of the present invention.
Figure 20B:
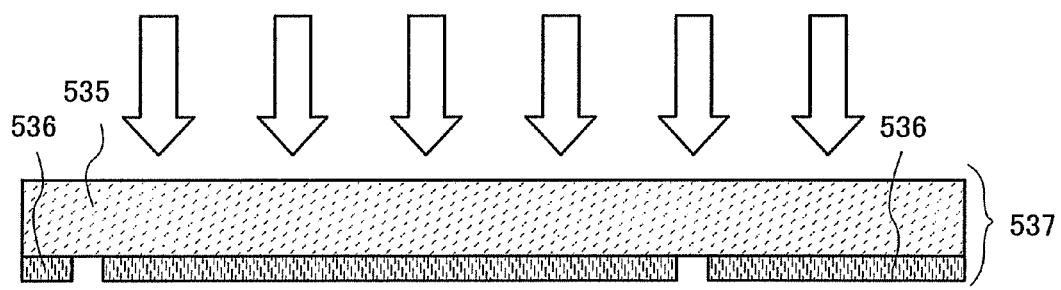
Figure 20C:
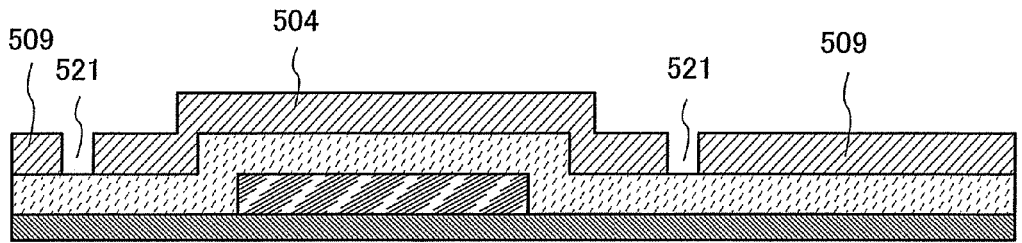

Next, a laser beam is passed through a photomask 537 (see FIG. 20B). The photomask 537 includes a light-transmitting substrate 535 and light-shielding layers 536. The light-shielding layers 536 are provided so as to transmit a laser beam and are not formed in a region corresponding to grooves 521.

By laser beam irradiation, the semiconductor film 531 is irradiated with a laser beam through a region in which the light-shielding layers 536 are not formed, and part of the semiconductor film 531 is sublimed, whereby the grooves 521 are formed. With the grooves 521, the semiconductor film 531 is separated into an island-shaped semiconductor film 504 to serve as an active layer and regions 509 that do not function as an active layer.

Next, an insulating film 505 is formed over the island-shaped semiconductor film 504 and the regions 509. The insulating film 505 may be formed of a silicon nitride film, a silicon oxide film, a silicon oxide film containing nitrogen, or a silicon nitride film containing oxygen, by a sputtering method or a CVD method.

A contact hole reaching the island-shaped semiconductor film 504 is formed in the insulating film 505. An electrode 506 which is one of a source electrode or a drain electrode and an electrode 507 which is the other one of the source electrode and the drain electrode are formed to be electrically connected to the island-shaped semiconductor film 504 through the contact hole.

Next, a pixel electrode 508 to be electrically connected to the electrode 507 is formed over the insulating film 505. The pixel electrode 508 may be formed of a similar material to that of the pixel electrode 406 and by a similar method thereof shown in FIGS. 18A and 18B.

Figure 19A:
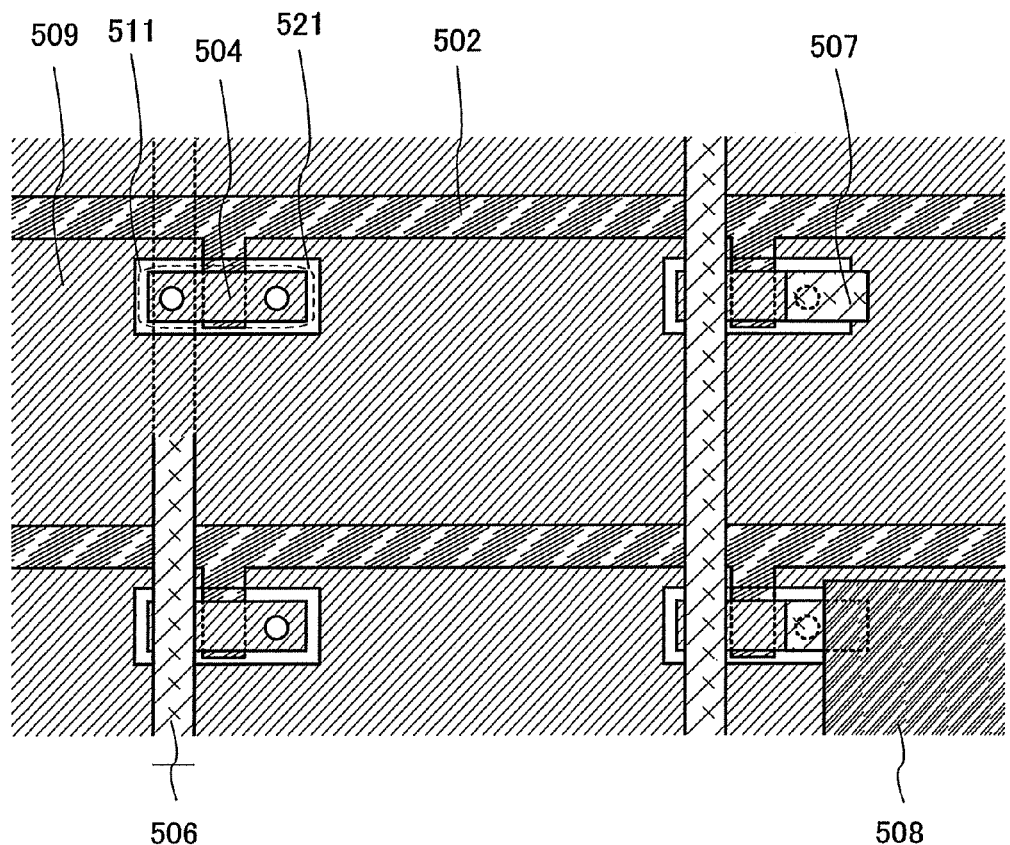
FIG. 19A is a top view showing a method for manufacturing a semiconductor device of the present invention.
Figure 19B:
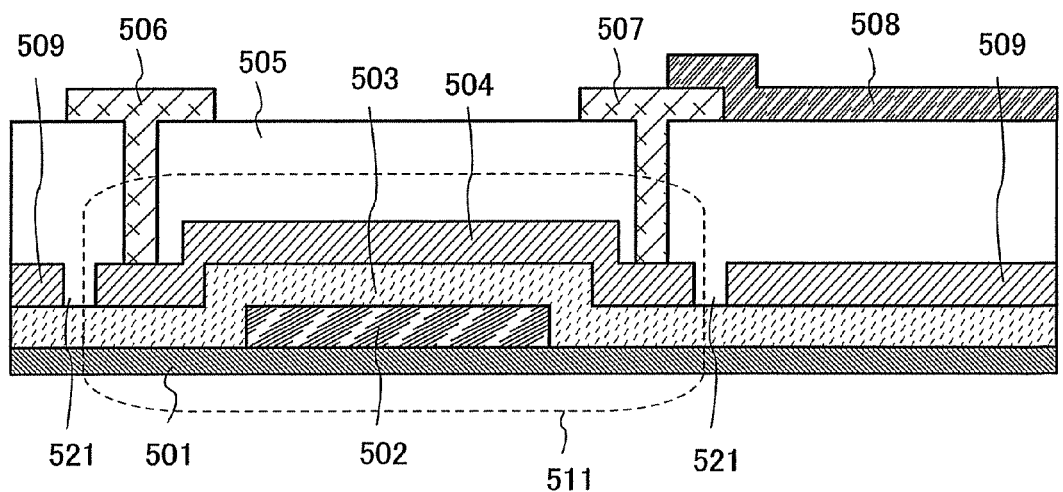
FIG. 19B is a cross-sectional view showing a method for manufacturing a semiconductor device of the present invention.

FIG. 19A is a top view of a TFT 511 and the pixel electrode 508 which are formed in this embodiment mode, and FIG. 19B is a cross-sectional view thereof. Note that in FIG. 19A, part of an element is omitted. In addition, although just four TFTs are shown in FIG. 19A, the number of TFTs is not limited thereto.

Embodiment Mode 6

As an electronic device having the semiconductor device shown in the above embodiment modes, a television device (also simply called a TV or a television receiver), a digital camera, a digital video camera, a mobile phone device (also simply called a mobile phone appliance or a mobile phone), a mobile information terminal such as a PDA, a mobile game machine, a monitor for a computer, a computer, a sound reproducing device such as a car audio device, an image reproducing device provided with a recording medium such as a home-use game machine, and the like are given. Specific examples of these will be described with reference to FIGS. 11A to 11F and FIG. 12.

Figure 11A:
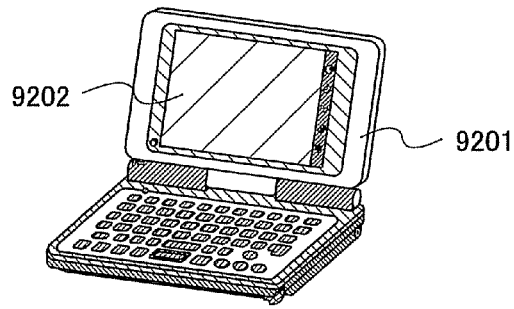
FIGS. 11A to 11F are views each illustrating an electronic device using a semiconductor device of the present invention.

A mobile information terminal shown in FIG. 11A includes a main body 9201, a display portion 9202, and the like. By applying the semiconductor device described in the above embodiment modes to the display portion 9202, the mobile information terminal can be provided at low price.

Figure 11B:
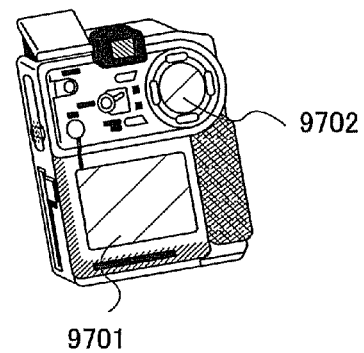

A digital video camera shown in FIG. 11B includes a display portion 9701, a display portion 9702, and the like. By applying the semiconductor device described in the above embodiment modes to the display portion 9701, the digital video camera can be provided at low price.

Figure 11C:
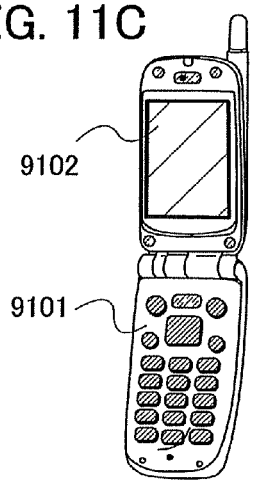

A mobile terminal shown in FIG. 11C includes a main body 9101, a display portion 9102, and the like. By applying the semiconductor device described in the above embodiment modes to the display portion 9102, the mobile terminal can be provided at low price.

Figure 11D:
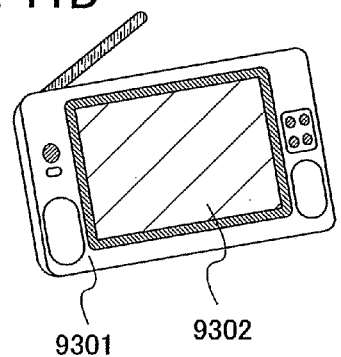

A mobile television device shown in FIG. 11D includes a main body 9301, a display portion 9302, and the like. By applying the semiconductor device described in the above embodiment modes to the display portion 9302, the mobile television device can be provided at low price. Such a television device can be widely applied to a small-sized device to be mounted on a mobile terminal such as a mobile phone, a middle-sized device that is portable, and a large-sized device (for example, 40 inches or more).

Figure 11E:
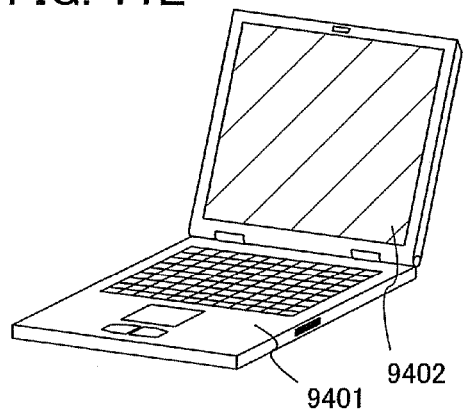

The mobile computer shown in FIG. 11E includes a main body 9401, a display portion 9402, and the like. By applying the semiconductor device described in the above embodiment modes to the display portion 9402, the mobile computer can be provided at low price.

Figure 11F:
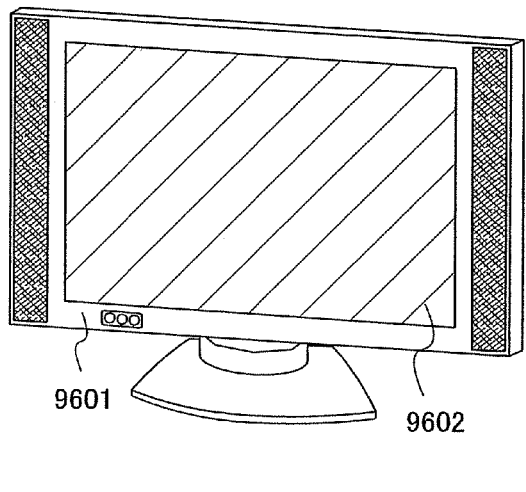

The television device shown in FIG. 11F includes a main body 9601, a display portion 9602, and the like. By applying the semiconductor device described in the above embodiment modes to the display portion 9602, the television device can be provided at low price.

Here, a structure of the television device is described with reference to FIG. 12.

Figure 12:
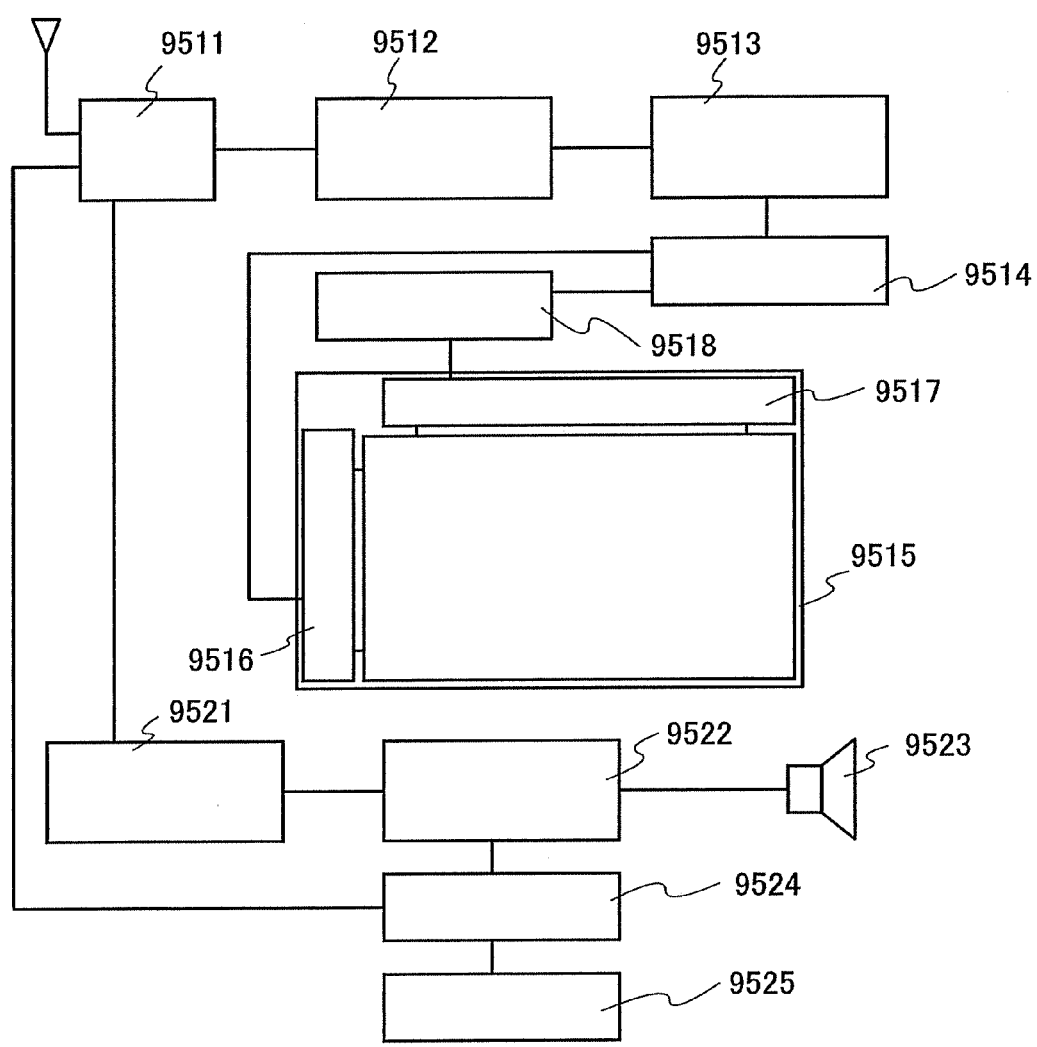
FIG. 12 is a diagram illustrating an electronic device using a semiconductor device of the present invention.

FIG. 12 is a block diagram showing the main structure of the television device. A tuner 9511 receives a video signal and an audio signal. The video signal is processed through a video detecting circuit 9512, a video signal processing circuit 9513 which converts the signal outputted from the video detecting circuit 9512 into a color signal corresponding to red, green, or blue, and a control circuit 9514 which converts the video signal into the input specification of a driver IC. The control circuit 9514 outputs signals to a scanning line driver circuit 9516 and a signal line driver circuit 9517 of a display panel 9515. In the case of digital driving, a signal dividing circuit 9518 may be provided on a signal line side, so that the inputted digital signal may be divided into m number of signals and supplied.

Of the signals received by the tuner 9511, the audio signal is sent to an audio detecting circuit 9521 and its output is supplied to a speaker 9523 through an audio signal processing circuit 9522. A controlling circuit 9524 receives control information such as a receiving station (receiving frequency) and sound volume from an input portion 9525, and sends signals to the tuner 9511 and the audio signal processing circuit 9522.

This television device is formed by the inclusion of the display panel 9515; therefore, electric power consumption of the television device can be reduced. In addition, a television device can be manufactured.

Note that the present invention is not limited to the television receiver and is applicable to various uses as a display medium particularly with a large area such as an information display board at a railway station, an airport, or the like, or an advertisement display board on the street as well as a monitor of a personal computer.

By the present invention, in a step for manufacturing a TFT and a semiconductor device formed with the TFT, the number of photolithography steps is reduced, a manufacturing process is simplified, and production can be performed with high yield at low cost.

This application is based on Japanese Patent Application serial No. 2006-233046 filed in Japan Patent Office on Aug. 30, 2006, the entire contents of which are hereby incorporated by reference.

What is claimed is:

1. A method for manufacturing a semiconductor device comprising:

forming a gate electrode and a gate insulating film over a substrate;

forming a first semiconductor film over the gate insulating film;

irradiating the first semiconductor film with a laser beam through a photomask including a shield, to form a groove by subliming the semiconductor film irradiated with the laser beam through a portion in which the shield is not formed, wherein the groove separates a region of an island-shaped semiconductor film to serve as an active layer and a region of a semiconductor film which does not function as the active layer;

forming an insulating film over the island-shaped semiconductor film and the region which does not function as the active layer; and forming a source electrode and a drain electrode over the insulating film, the source electrode and the drain electrode being electrically connected to the island-shaped semiconductor film.

2. A method for manufacturing the semiconductor device according to claim 1, wherein the gate electrode is formed in such a way that a shield for shielding a laser beam over a light-transmitting substrate is used as a photomask, a second semiconductor film formed as a first layer and a metal film formed as a second layer which are formed over a light-transmitting substrate are used as a source substrate, and the metal film is formed over the substrate as the gate electrode by subliming the second semiconductor film in such a way that the source substrate is irradiated with the laser beam through the photomask.

3. A method for manufacturing the semiconductor device according to claim 1, wherein the first semiconductor film is any one of a zinc compound semiconductor film and an oxide semiconductor film.

4. A method for manufacturing the semiconductor film according to claim 3, wherein the zinc compound semiconductor film comprises any one of zinc oxide, a mixed crystal semiconductor containing zinc oxide, and zinc sulfide.

5. A method for manufacturing the semiconductor device according to claim 2, wherein the second semiconductor film is any one of a zinc compound semiconductor film and an oxide semiconductor film.

6. A method for manufacturing the semiconductor film according to claim 5, wherein the zinc compound semiconductor film comprises any one of zinc oxide, a mixed crystal semiconductor containing zinc oxide, and zinc sulfide.

* * * * *